(12) United States Patent  (10) Patent No.: US 7,400,191 B2
Rodriguez  (45) Date of Patent: Jul. 15, 2008

(54) SWITCHING POWER AMPLIFIER

(76) Inventor: Manuel De Jesus Rodriguez, 8234 Wynne Ave., Reseda, CA (US) 91335

( * ) Notice: Subject to any disclaimer, the term of this patent is extended or adjusted under 35 U.S.C. 154(b) by 139 days.

(21) Appl. No.: 11/400,820

(22) Filed: Apr. 7, 2006

(65) Prior Publication Data
US 2007/0247219 A1 Oct. 25, 2007

(51) Int. Cl.
H03F 3/38 (2006.01)
(52) U.S. Cl. .......................... 330/10; 330/251
(58) Field of Classification Search ............ 330/207 A, 330/10, 251; 375/238
See application file for complete search history.

(56) References Cited

U.S. PATENT DOCUMENTS

| 3,629,616 | A |  | 12/1971 | Wlker |
|---|---|---|---|---|
| 4,531,096 | A |  | 7/1985 | Yokoyama |
| 5,014,016 | A |  | 5/1991 | Anderson |
| 5,160,896 | A |  | 11/1992 | McCorkle |
| 5,617,058 | A |  | 4/1997 | Adrian et al. |
| 5,805,020 | A |  | 9/1998 | Danz et al. |
| 5,838,193 | A |  | 11/1998 | Myers et al. |
| 5,963,086 | A |  | 10/1999 | Hall |
| 5,973,368 | A | * | 10/1999 | Pearce et al. ............. 257/368 |
| 5,982,231 | A |  | 11/1999 | Nalbant |
| 6,016,075 | A |  | 1/2000 | Hamo |
| 6,072,361 | A |  | 6/2000 | Myers et al. |
| 6,078,214 | A |  | 6/2000 | Zhang |
| 6,091,292 | A |  | 7/2000 | Higashiyama et al. |
| 6,097,249 | A |  | 8/2000 | Strickland et al. |
| 6,229,388 | B1 |  | 5/2001 | Nalbant |
| 6,246,283 | B1 |  | 6/2001 | Ahuja et al. |
| 6,282,747 | B1 |  | 9/2001 | Morgan et al. |
| 6,297,692 | B1 |  | 10/2001 | Nielsen |
| 6,356,151 | B1 |  | 3/2002 | Nalbant |
| 6,429,737 | B1 |  | 8/2002 | O'Brien |
| 6,498,531 | B1 |  | 12/2002 | Ulrick et al. |
| 6,563,377 | B2 |  | 5/2003 | Butler |
| 6,794,932 | B1 | * | 9/2004 | Butler ..................... 330/10 |

* cited by examiner

Primary Examiner—Robert Pascal
Assistant Examiner—Hieu P Nguyen
(74) Attorney, Agent, or Firm—Peter Ganjian

(57) ABSTRACT

The present invention discloses a switching amplifier, comprising a modulator for converting a main input signal to a high frequency modulated switching signal and for providing voltage amplification of the main input signal. The present invention further includes a power output stage coupled with an output of the modulator for receiving the voltage amplified main input signal and for providing a current amplification of the main input signal for providing a main output signal for deriving a load. Further included is a feedback module for correction of the main output signal in relation to the main input signal.

22 Claims, 15 Drawing Sheets

SWITCHING POWER AMPLIFIER

BACKGROUND OF THE INVENTION (1) Field of the Invention

This invention relates to power amplifiers and, more particularly, to switching power amplifiers that can efficiently and linearly amplify a signal.

(2) Description of Related Art

Amplifiers are electronic devices that are used for increasing the power of a signal, and are generally categorized into various classes. Reference is made to the exemplary U.S. Patents that disclose various types of amplifiers: U.S. Pat. Nos. 6,563,377; 6,498,531; 6,429737; 6,356,151; 6,297,692; 6,282,747; 6,246,283; 6,229,388; 6,097,249; 6,091,292; 6,078,214; 6,072,361; 6,016,075; 5,982,231; 5,973,368; 5,963,086; 5,838,193; 5,805,020; 5,617,058; 5,160,8969; 5,014,016; 4,531,096; and 3,629,616.

In general, class A amplifiers produce a linearly amplified replica of an input signal, but are inefficient in terms of power usage (generating a great amount of heat) because the amplifying elements are always biased and conducting, even if there is no input. With class A amplifiers, 100% of the input signal cycle is used to actually switch on the amplifying devices.

The prior art FIG. 1 A is an exemplary illustration of a conventional class A amplifier 100 that amplify a differential input signal over the whole of the input cycle, having a differential input 106 with input signal terminals 102 and 104. With class A amplifier 100, the amplifying elements 122 and 124 (also constituting a buffer output stage) are biased by voltage sources 126 (+VCC) and 128 (−VCC) and the current sources 112 and 120. The biasing of the amplifier 100 is such that the amplifying elements are always conducting to some extent, and are operated over the most linear portion of their characteristic curve (known as transfer function or transconductance curve). In general, class A amplifiers are inefficient in terms of power usage because the amplifying element(s) are always biased and conducting, even if there is no input signal to be amplified.

As illustrated in the prior art FIG. 1A, a typical class A linear amplifier 100 with differential input 106 is comprised of a negative or inverted input terminal 102 coupled with a base of a first transistor 108, and a positive or non-inverted input terminal 104 coupled with a base of a second transistor 110. A current source generator 130, through a current source 112, biases the differential input 106. The emitters of the first transistor 108 and the second transistor 110 are coupled with the current source 112 for providing a precise, constant current level to the differential input transistors 108 and 110 for maintaining the differential signal between the two inputs. The collectors of the transistors 108 and 110 are coupled with respective secondary current sources 114 and 116, with the secondary current sources 114 and 116 coupled with one another through a feedback 118. The secondary current sources 114 and 116 with the feedback 118 accurately impose and maintain the differential input current passing through the transistors 108 and 110. As further illustrated, the current passing through the transistor 110 is supplied to the base of the second output-amplifying transistor 124, with a base of the first output-amplifying transistor 122 being supplied via a current source 120. With class A linear amplifiers with a differential input, the output signal 132 is a linear, amplified replica of the difference between the input signals. Therefore, constant current sources 112 and 120 are used to maintain a constant output that accurately reflects the amplified differential input. Biasing of the output amplifying elements 122 and 124 by the voltage sources 126 (+VCC) and 128 (−VCC) and the current sources 112 and 120 prevents crossover distortions because the amplifying elements are always ON, generating the linearly amplified replica of the original signal (differential signal). However, this is also the cause for the inefficiency of this type of amplifier.

The push-pull class B amplifiers amplify a signal through the balance of non-saturated sink and source (push-pull) output stage sections. This arrangement provides excellent efficiency (compared to class A amplifiers) because there is no biasing of the output amplifying elements by current sources. That is, unlike the class A amplifiers, the amplifying elements of class B amplifiers are not constantly ON. However, this introduces crossover distortion caused by a small glitch 160 (FIG. 1B) at the "link" between the two halves of the signal generated by the sink and the source. Regrettably, most solutions to reduce the crossover distortion (the small glitch 160 at the link between the two halves of the signal) reduce the efficiency of the class B amplifiers.

The prior art FIG. 1B is an exemplary illustration of a class B linear power amplifier 140, which is comprised of an amplifying stage 142 and power stage 144. The amplifying stage 142 is comprised of an input terminal 146 that is coupled with a base of a first NPN Bipolar Junction Transistor (BJT) 148 and a base of a first PNP BJT 150. The emitters of the BJTs 148 and 150 are coupled together with ground GND. When a signal greater than the biasing signal of either transistor is applied to the transistors (assuming during a first half cycle of the input signal with a first polarity), the transistor 148 turns ON (+$V_{BE}$), and the transistor 150 remain OFF. Activation of the transistor 148 places a first polarity voltage across the resistor 152 coupled in between the positive voltage source +VCC 154 and the collector of the NPN BJT transistor 148. The current generated due to the voltage across the resistor 152 passes through the collector-emitter junction of the NPN BJT transistor 148 and to ground GND. The PNP transistor 150 is OFF due to the first polarity of the input signal, and hence, is "seen" as high impedance "open circuit." The voltage across the resistor 152 also biases the second PNP transistor 156 in the power stage 144, placing a first polarity voltage (+$V_{BE}$) across the base-emitter junction of transistor 156. The biasing of the second PNP transistor 156 allows current to pass through the emitter-collector junction, which current is an amplified replica of the first half of the input signal, and is fed to the load 158. During the first half cycle of the input signal, the first PNP transistor 150 and the second NPN transistor 162 are OFF. Both transistors 150 and 162 function as "open circuit" and are "seen" as high impedance elements during this first half cycle of the input signal.

It should be noted that there are no current sources with class B amplifiers, and hence, before the second half cycle of the input signal commences (during the zero-crossing of the input signal), all of the transistors are turned OFF due to the fact that the input signal strength is near zero, which is below the biasing threshold of the transistors. The small glitch 160 at the link between the two halves of the input signal is therefore due to the fact that all transistors are OFF during this crossover period. Upon crossover of the input signal to a second polarity, passing the biasing threshold of either of the transistors 148 and 150, in the second half of the cycle of the input signal, the transistor 150 is activated (−$V_{BE}$ functions as a sink) and transistor 148 remains OFF.

Activation of the transistor 150 places a second polarity voltage across the resistor 166 that is coupled in between the negative voltage source −VCC 164 and the collector of the PNP BJT transistor 150. The current generated due to the voltage across the resistor 166 passes through the emitter-collector junction of the PNP BJT transistor 150 and to ground GND. The NPN transistor 148 is OFF due to the second polarity of the input signal, and hence, is "seen" as high impedance "open circuit." The voltage across the resistor 166 also biases the second PNP transistor 162 in the power stage 144, placing a second polarity voltage ($-V_{BE}$) across the base-emitter junction of transistor 162. The biasing of the second NPN transistor 162 allows current (sink current) to pass through the collector-emitter junction, which current is an amplified replica of the second half of the input signal, and is fed to the load 158. During the second half cycle of the input signal, the first NPN transistor 148 and the second PNP transistor 156 remain OFF. Both transistors 148 and 156 function as "open circuit" and are "seen" as high impedance elements during this second half cycle of the input signal. Accordingly, not constantly biasing ON all of transistors of a class B amplifiers during the full (or whole) cycle of the input signal produces the glitch 160 when the input signal falls below the biasing threshold of the transistors during its zero crossing.

Class D amplifiers are switching power amplifiers where all power devices are operated in ON/OFF mode. The switching elements of class D amplifier are either cut off or in saturation most of the time, allowing for high efficiencies. The high efficiency translates into reduced heat sinking, smaller size, and lighter weight. Further, in general, class D amplifiers do not suffer from crossover distortion within the audio bandwidth.

The prior art FIG. 1C is an exemplary illustration of a typical Half-Bridge class D switching power amplifier 170, with a triangle wave generator 172 creating a triangle waveform carrier frequency. In general, class D amplifiers convert the audio signal 176 into high-frequency pulses that switch the output in accordance with the audio input signal 176. Some class D amplifier use pulse width modulators to generate a series of conditioning pulses that vary in width with the audio signal's amplitude. The varying-width pulses switch the power-output transistors 182 and 184 at a fixed frequency. In general, the output of the class D amplifier is fed into a low-pass filter 190 that converts the pulses back into an amplified audio signal 192 that drives an audio system 194. This design approach produces an amplifier with better than 90% efficiency, but is much more complex than its linear counterpart (class A or class B amplifiers).

As illustrated, the basic circuit layout of the class D amplifier is substantially similar to that of linear amplifiers, such as classes A and B, with a major difference being in the signals provided to an output stage. Rather than feeding an audio waveform directly to the output stage, as is done in linear amplifiers, the class D amplifier first feeds the audio waveform into a Pulse Width Modulator (PWM) circuit that feeds modulated pulses to the output stage. By quickly switching the output stage completely ON and completely OFF with varying pulse widths, the class D amplifier is able to recreate waveforms of almost any shape, and, by filtering the switching output, sound is produced by a loudspeaker connected thereto.

FIG. 1D is a schematic illustration of a typical triangular wave generator used in prior art. It should be noted that the prior art triangular wave generators 172 illustrated in FIG. 1D require at least a two stage IC operational amplifiers to generate the triangular wave at the output OUT-1, with the output OUT-2 of the first stage producing a square wave. The triangle waveform at OUT-1 sets the resulting switching frequency of the switching power amplifier of FIG. 1C.

Referring back to FIG. 1C, conventional voltage comparator 174 compares the triangle waveform with the command input signal (audio input) at 176. The PWM signal 178 from the comparator 174 is then sent to a field effect transistor (FET) driver integrated circuit 180 that drives the output FET's 182, 184. The upper N-channel output FET 182 switches a bus voltage supplied from +VDD and the lower P-channel output FET 184 switches a bus voltage supplied from −VDD to produce a high-voltage PWM waveform 186 illustrated at test point 188. This means that the output will not be a linearly amplified replica of the input, and therefore, must be processed further. The further processing is comprised of an LC filter 190, which reproduces the audio signal (amplified) 192 at the load 194.

As indicated above, class D amplifiers yield higher efficiency than other class amplifiers through use of saturated mutually exclusive source and sink switching devices. Despite their efficiency, most class D amplifiers are comprised of complex proprietary Integrated Circuits (ICs) for control of the switches, cannot accurately reproduce the input waveform except for low fidelity applications, and are subject to power supply perturbations.

In summary, class A amplifiers produce a linearly amplified replica of an input signal, but are inefficient in terms of power usage. The push-pull class B amplifiers provide excellent efficiency (compared to class A amplifiers), but introduce crossover distortion. Class D amplifiers are efficient, and produce a fairly accurate linearly amplified replica of an input signal, but are comprised of complex proprietary Integrated Circuits (ICs) for control of the power output switches, and require power regulation for proper operation.

Accordingly, in light of the current state of the art and the drawbacks to current amplifier devices mentioned above, a need exists for an amplifier that would have simple, non-proprietary circuit topography that would allow for the use of off-the-shelf components, that would continue to be highly efficient, that would not require power supply regulations, and that would produce a linear amplified replica of an input signal.

BRIEF SUMMARY OF THE INVENTION

The present invention discloses a hybrid switching power amplifier that produces a linear replica of an input single, is highly efficient, does not use complex proprietary ICs, and does not require a power supply regulator and is substantially immune to power supply perturbations.

One aspect of the present invention provides a switching amplifier, comprising:

a modulator for converting a main input signal to a high frequency modulated switching signal and for providing voltage amplification of the main input signal;

a power output stage coupled with an output of the modulator for receiving the voltage amplified main input signal and for providing a current amplification of the main input signal for providing a main output signal for deriving a load; and a feedback module for correction of the main output signal in relation to the main input signal.

An optional aspect of the present invention provides a switching amplifier, wherein:

the modulator is comprised of:

a constant switching current source and voltage level translator for providing constant current and voltage to the power output stage;

a comparator coupled with an input of the constant switching current source and level translator through a regulator mechanism, with the comparator comparing the main input signal with the main output signal for maintaining a linearly amplified replica of the main input signal;

a ramp generator coupled with the input of the constant switching current source and level translator through the regulator mechanism, with the ramp generator providing a modulation frequency for the switching amplifier;

the regulator mechanism coupled with the input of the constant switching current source and level translator for regulating a voltage of the switching amplifier.

Another optional aspect of the present invention provides a switching amplifier, wherein:

the constant switching current source and level translator is comprised of a first constant switching current source and level translator having a first polarity, and a second constant switching current source and voltage level translator having a second polarity;

Yet another optional aspect of the present invention provides a switching amplifier, wherein:

the first constant switching current source and level translator is comprised of a first transistor having a first terminal coupled with the regulator mechanism, a second terminal coupled with a first polarity impedance, and a third terminal coupled with a second impedance; and the second constant switching current source and level translator is comprised of a second transistor with the second transistor having a first terminal coupled with the regulator mechanism, a second terminal coupled with a second polarity impedance, and a third terminal coupled with a third impedance.

A further optional aspect of the present invention provides a switching amplifier, wherein:

the constant switching current source and level translator is a linear amplifier.

Still a further optional aspect of the present invention provides a switching amplifier, wherein:

the comparator is coupled with a first transistor and a second transistor of the linear amplifier by a first impedance;

the ramp generator coupled with the first transistor and the second transistor of the linear amplifier by a second impedance.

Another optional aspect of the present invention provides a switching amplifier, wherein:

the comparator is comprised of a linear differential amplifier used as an error amplifier.

Yet another optional aspect of the present invention provides a switching amplifier, wherein:

the linear differential amplifier is further comprised of a buffer output stage.

A further optional aspect of the present invention provides a switching amplifier, wherein:

the ramp generator is comprised of:

an operational amplifier;

a first impedance and a second impedance coupled in series, and coupled with a first terminal of the operational amplifier, with the first impedance and the second impedance having parameters commensurate with an internal capacitance of the operational amplifier for generating a linearly sloped wave signal.

Still a further optional aspect of the present invention provides a switching amplifier, wherein:

the regulator mechanism is comprised of:

one or more clamping devices for maintaining constant voltage across the constant current source and level translator; and one or more current limiters for maintaining constant current through the constant switching current source and level translator.

Another optional aspect of the present invention provides a switching amplifier, wherein:

the power output stage is comprised of:

one or more buffer-derivers for operating one or more output power transistor switches that provide high frequency current; and a recovery circuit for filtering a high frequency component of the current for outputting the main output signal for deriving the load.

Yet another optional aspect of the present invention provides a switching amplifier, wherein:

the power output stage is a half bridge output stage.

A further optional aspect of the present invention provides a switching amplifier, wherein:

the power output stage is a full bridge output stage.

Still a further aspect of the present invention provides a switching amplifier, wherein:

the power output stage is a half bridge bootstrap.

Another optional aspect of the present invention provides a switching amplifier, wherein:

the power output stage is a self-oscillating output stage.

Yet another optional aspect of the present invention provides a switching amplifier, wherein:

the feedback module is comprised of:

a switching feedback circuitry coupled between the power output stage and the modulator for removal of input signal distortions and maintaining of overall signal gain for the switching amplifier; and a phase lag compensation coupled between the power output stage and the modulator to modify phases of the main output signal in relation to that of the main input signal for avoiding oscillations.

Another aspect of the present invention provides a method for signal amplification, comprising the acts of:

receiving a main input signal;

modulating the system input signal for outputting a modulated signal;

providing the modulated signal to a power switching stage for voltage and current amplifications of the modulated signal for deriving a load; and recovering the main output signal by removing a modulated component for deriving the load and for providing feedback signal as the output feedback signals to a feedback module.

A further optional aspect of the present invention provides a method for signal amplification, wherein:

the act of receiving the main input signal is further comprised of an act of comparing the main input signal with the output feedback signals for detection and correction of overall system signal processes.

Still a further optional aspect of the present invention provides a method for signal amplification, wherein:

the act of modulating system input signal is comprised of:

comparing the main input signal with an output signal for maintaining a linearly amplified replica of the main input signal and generating a system input signal;

providing a linearly sloped signal;

regulating the system input signal and the linearly sloped signal for providing a constant switching current and voltage to a power switching stage.

Another optional aspect of the present invention provides a method for signal amplification, wherein:

the act of providing the linearly sloped signal is comprised of the act of:

providing an impedance having a parameter commensurate with an internal capacitance of a signal generator for generating the linearly sloped signal.

Yet another optional aspect of the present invention provides a method for signal amplification, wherein:

the impedance is selected to equal to the resonant frequency of the internal capacitance of the signal generator.

A further optional aspect of the present invention provides a method for signal amplification, wherein:

the act of regulating the system input signal and the linearly sloped signal is comprised of:

limiting current for providing a constant system input signal and linearly sloped signal; and clamping voltage input sources for maintaining a constant voltage.

Still a further optional aspect of the present invention provides a method for signal amplification, wherein:

the act of coupling the modulated signal with a power switching stage is comprised of:

providing a constant switching current source for modulation of the system input signal based on the linearly sloped signal frequency, and for providing a constant switching voltage for the power switching stage.

Another optional aspect of the present invention provides a method for signal amplification, wherein:

the act of providing the constant switching current source and the constant switching voltage is comprised of the act of:

providing the system input signal based on the linearly sloped signal frequency to the power switching stage in accordance with one of a first polarity and a second polarity.

A further optional aspect of the present invention provides a method for signal amplification, wherein:

the act of recovering the main output signal is comprised of an act of demodulating the modulated signal for removal of a modulation component; and the act of demodulating is comprised of filtering the modulation component through one or more low pass filters for output of the main output signal for the load.

These and other features, aspects, and advantages of the invention will be apparent to those skilled in the art from the following detailed description of preferred non-limiting exemplary embodiments, taken together with the drawings and the claims that follow.

BRIEF DESCRIPTION OF THE DRAWINGS

It is to be understood that the drawings are to be used for the purposes of exemplary illustration only and not as a definition of the limits of the invention. Throughout the disclosure, the word "exemplary" is used exclusively to mean "serving as an example, instance, or illustration." Any embodiment described as "exemplary" is not necessarily to be construed as preferred or advantageous over other embodiments.

Referring to the drawings in which like reference character (s) present corresponding parts throughout.

DETAILED DESCRIPTION OF THE INVENTION

The detailed description set forth below in connection with the appended drawings is intended as a description of presently preferred embodiments of the invention and is not intended to represent the only forms in which the present invention may be constructed and or utilized.

Figure 2A:
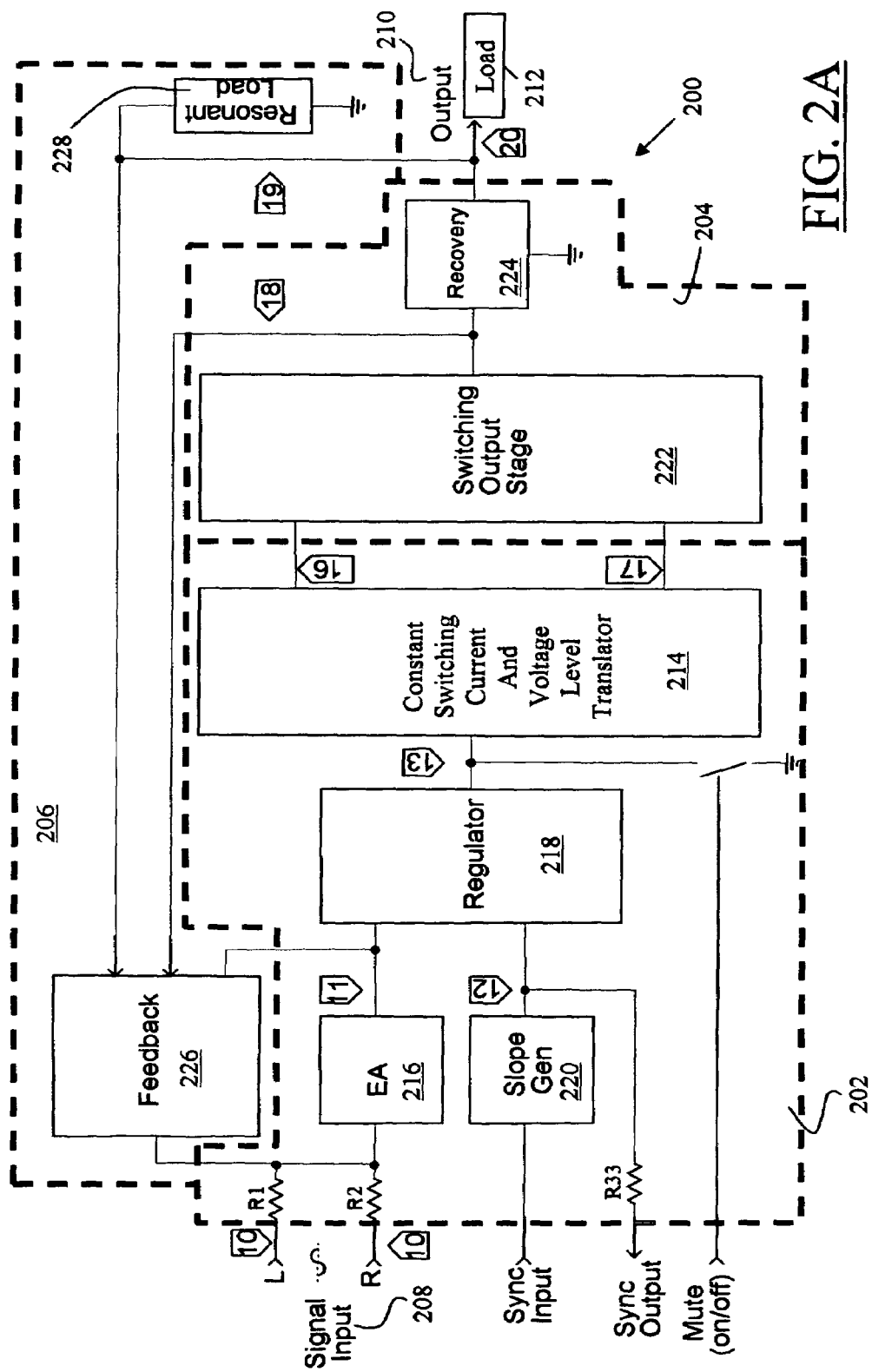
FIG. 2A is an exemplary simplified schematic block diagram illustration of a switching power amplifier in accordance with the present invention.

FIG. 2A is an exemplary simplified schematic block diagram illustration of a switching power amplifier 200 in accordance with the present invention, and FIGS. 3(A) to 3(N) are exemplary waveform diagrams illustrating the various waveforms at particular points in the circuits of FIGS. 2A to 2C, and FIGS. 4 to 11. As illustrated, the present invention discloses a switching power amplifier 200 that produces a linearly amplified replica of an input signal, provides the advantages and the functionality of a class D amplifier, but without the problems in relation to complex circuit topography and proprietary aspect related to the class D amplifiers, and does not require a regulated power supply.

As illustrated in FIG. 2A, the switching power amplifier 200 of the present invention is comprised of a modulator 202 for converting a main input signal 208 at point 10 to a high frequency modulated switching signal, and for providing for a voltage amplification of the main input signal 208. A non-limiting exemplary waveform for a main input signal 208 at point 10 is illustrated in FIG. 3(A). The switching power amplifier 200 is further comprised of a power output stage 204 coupled with an output of the modulator 202 for receiving the voltage amplified main input signal 208 and for providing a current amplification of the main input signal 208 for providing a main output signal 210 at point 20 for driving a load 212. A non-limiting exemplary waveform for main output signal 210 at point 20 is illustrated in FIG. 3(N). Further included with the switching power amplifier 200 of the present invention is a feedback module 206 for correction of the main output signal 210 at point 20 (FIG. 3(N)) in relation to the main input signal 208 at point 10 (FIG. 3(A)).

As further illustrated in the exemplary FIG. 2A, the modulator 202 is comprised of a comparator 216 that compares the main input signal 208 with the main output signal 210 (via the feedback module 206) for maintaining a linearly amplified replica of the main input signal 208. Modulator 202 further includes a slope generator 220 for providing a modulation frequency for the switching power amplifier 200, and further includes a regulator 218 that is used for regulating current and voltage of the switching amplifier 200. In particular, the output of the regulator 218 at point 13 (a non-limiting exemplary waveform of which is illustrated in FIG. 3(D)) is coupled with a constant switching current source and voltage level translator 214, for regulating a voltages across and current through the constant switching current source and voltage level translator 214. The input to the constant switching current source and voltage level translator 214 from regulator 218 at point 13 may be thought of as a summing point. That is, the input at point 13 sums or combines the regulated outputs (via regulator 218) of the comparator 216 and the slope generator 220. The constant switching current source and voltage level translator 214 of the modulator 202 provides a constant current and voltage to the power output stage 204. In general, the power output stage 204 is comprised of a switching output stage 222 for providing a high frequency current, and a recovery circuit 224 for filtering the high frequency component of the current for outputting the main output signal 210 for driving the load 212. The feedback module 206 is coupled between the power output stage 204 and the modulator 202 for removal of input signal distortions, prevention of oscillations, and maintaining of overall signal gain for the switching power amplifier 200.

Figure 2B:
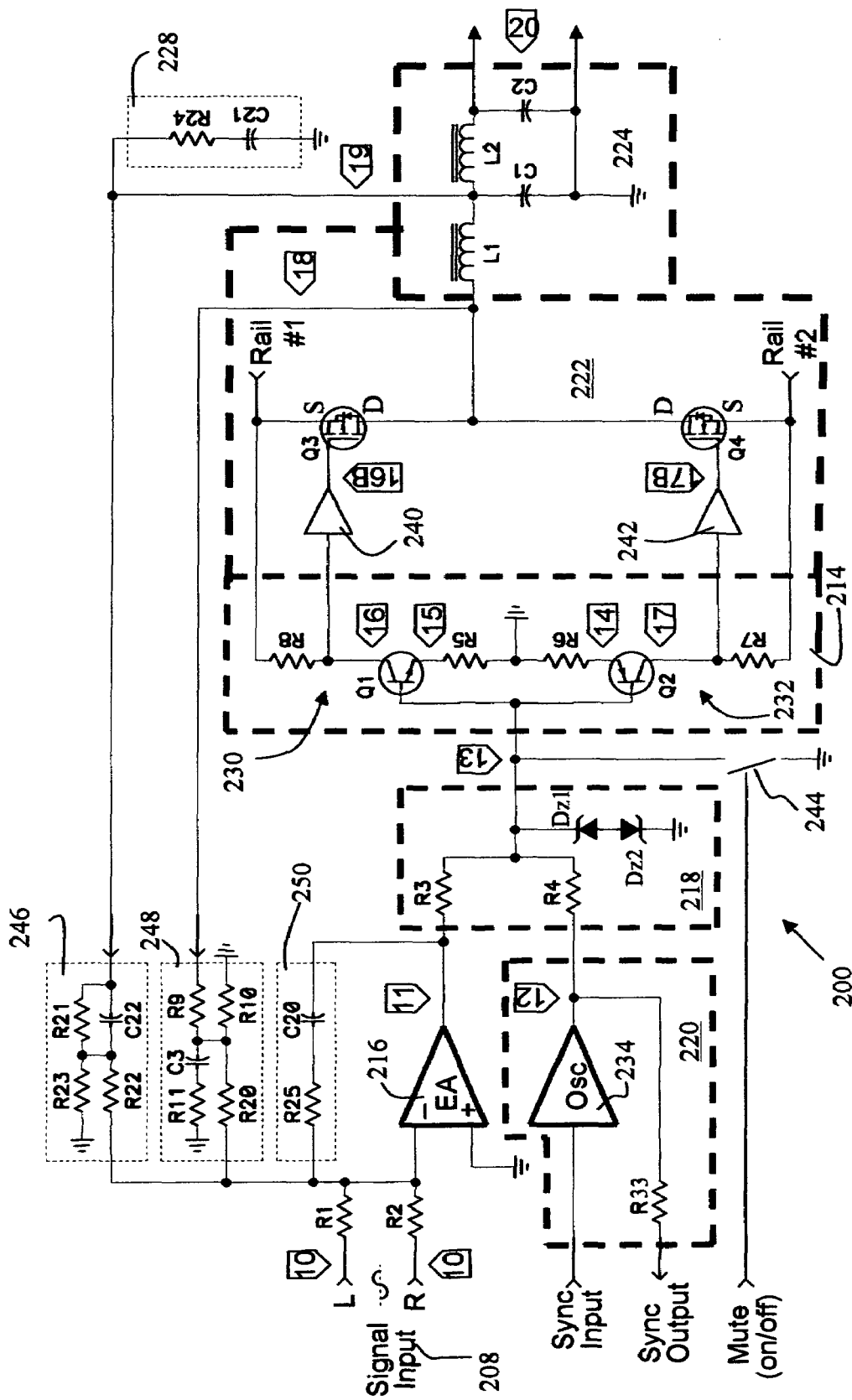
FIGS. 2B and 2C are exemplary schematic illustrations of the switching power amplifier illustrated in FIG. 2A in accordance with the present invention.
Figure 2C:
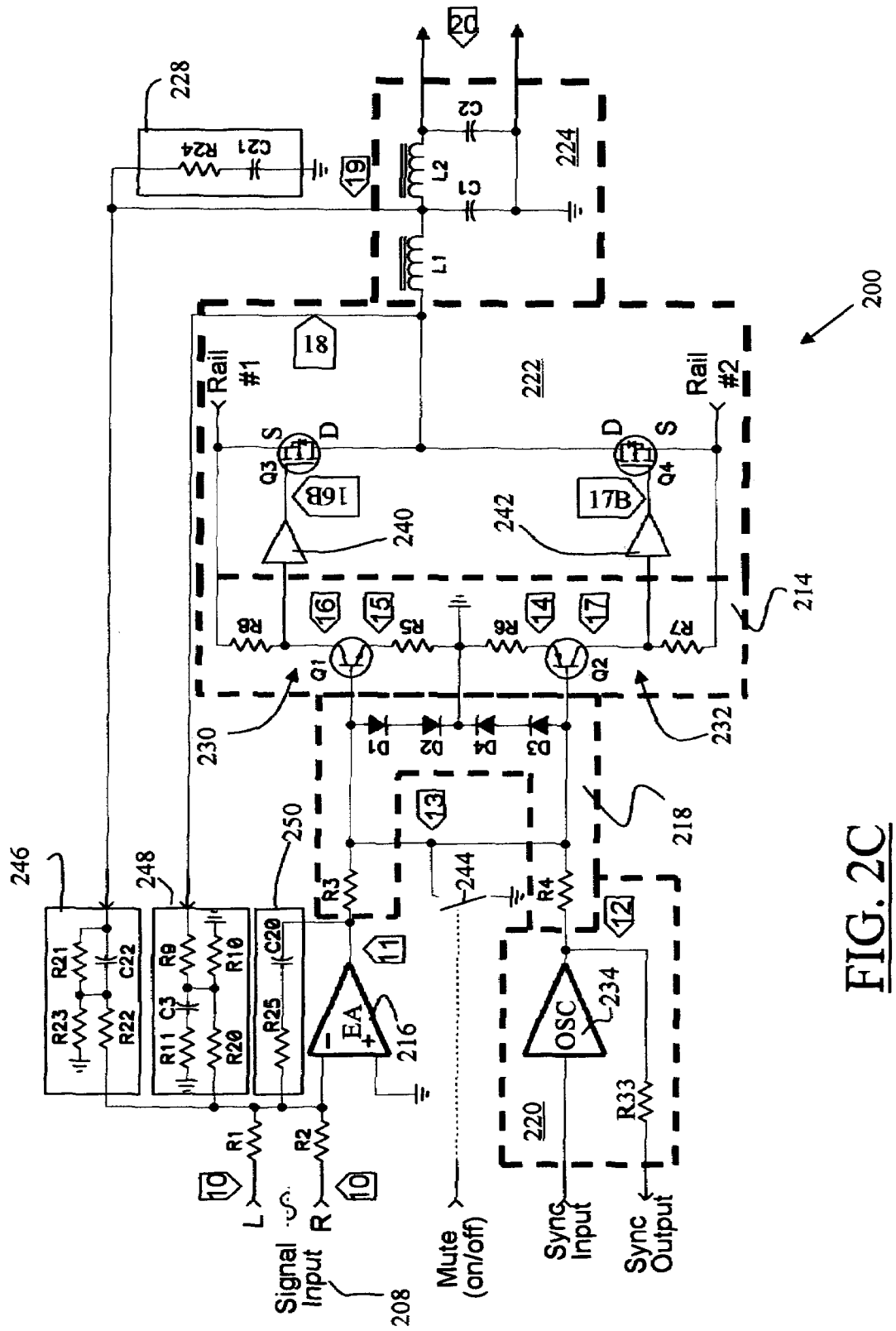
Figure 3:
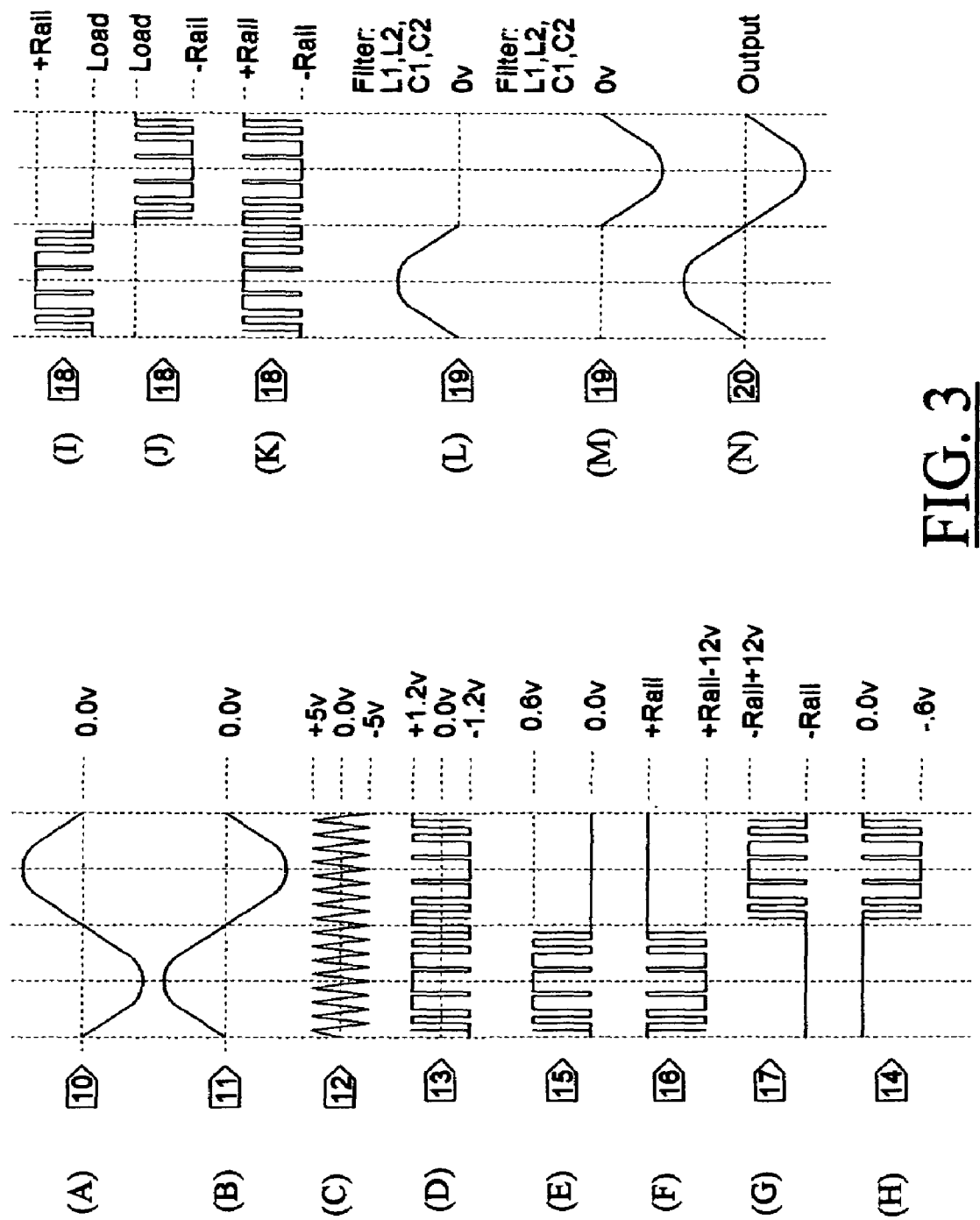
FIGS. 3(A) to 3(N) are exemplary waveform diagrams illustrating the various waveforms at particular points in the circuits of various figures, in accordance with the present invention.

FIGS. 2B and 2C are exemplary schematic illustrations for the switching power amplifier 200, detailing the exemplary simplified schematic block diagram that is illustrated in FIG. 2A. FIG. 2B is an exemplary illustration of one embodiment for the switching power amplifier 200 where the regulator 218 includes the use of Zener diodes Dz1 and Dz2 as clamping devices, whereas FIG. 2C shows the use of diodes D1 to D4 as clamping devices. In fact, any well-known clamping devices, including transistor switches configured as clamping devices may be used. Otherwise, the switching power amplifiers illustrated in FIGS. 2B and 2C are identical and hereinafter are referred to as switching power amplifier 200.

Figure 1B:
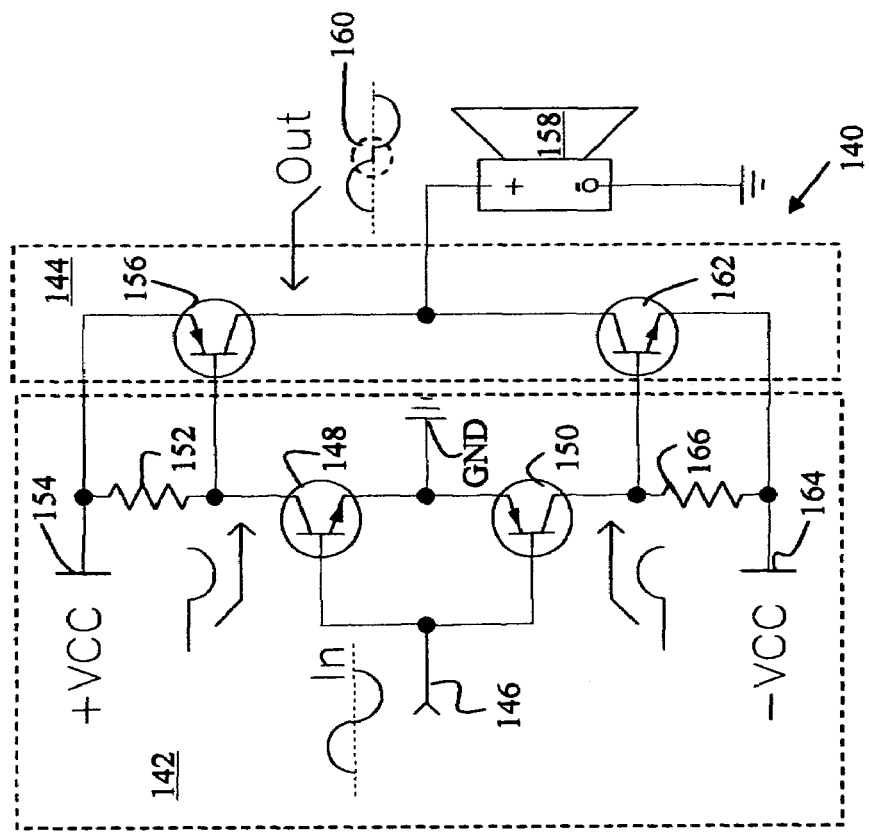
FIG. 1B is an exemplary schematic illustration of a prior art class B linear power amplifier.
Figure 1A:
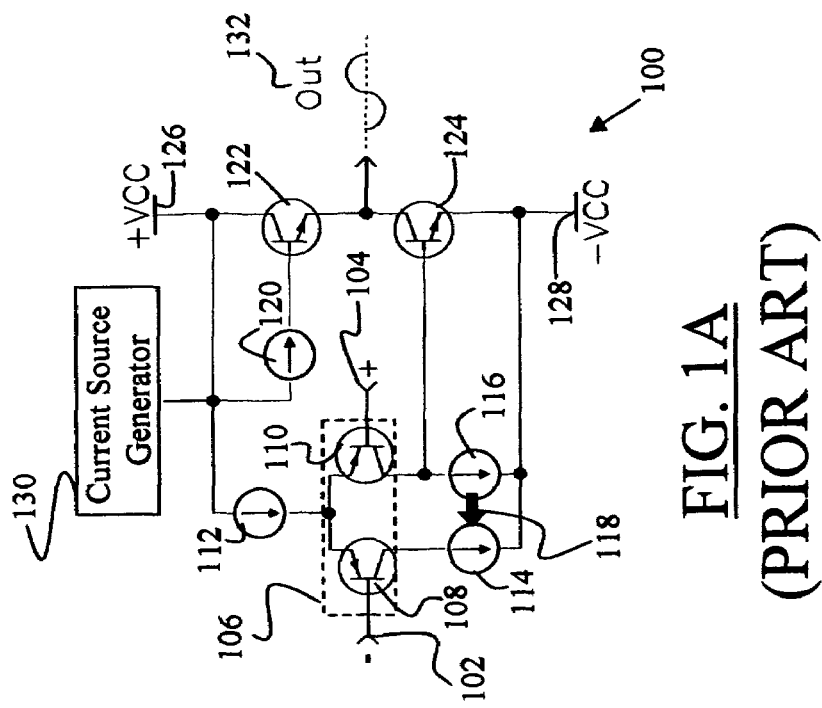
FIG. 1A is an exemplary schematic illustration of a prior art class A linear differential amplifier.
Figure 1C:
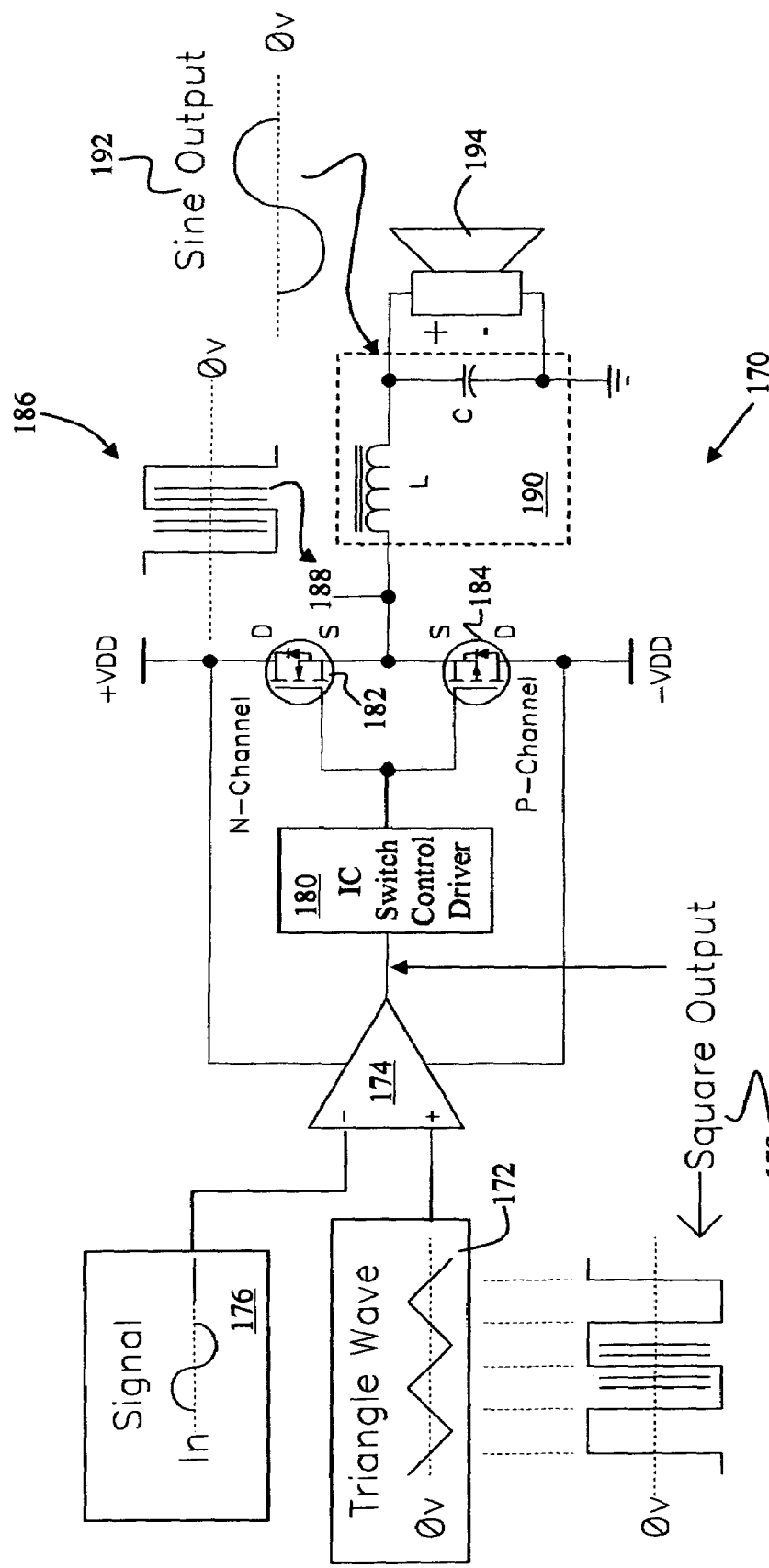
FIG. 1C is an exemplary schematic illustration of a prior art class D switching power amplifier.
Figure 1D:
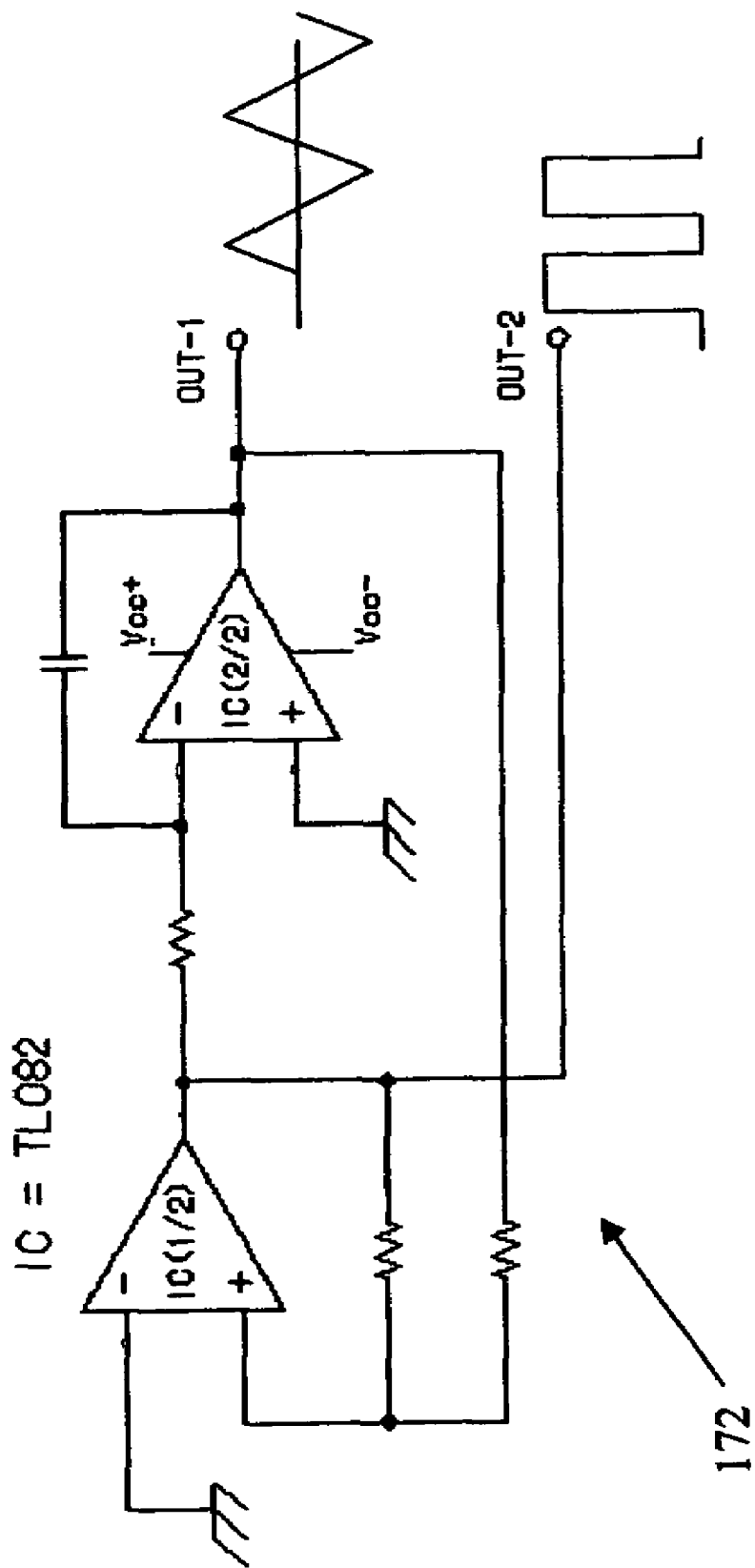
FIG. 1D is an exemplary schematic illustration of a typical triangular wave generator used in prior art.

As illustrated in both FIGS. 2B and 2C, a main input signal 208 at point 10 in combination with a feedback signal is coupled with a negative or inverted input terminal of the comparator 216 through a resistor R2, with the comparator 216 functioning as an error amplifier. The comparator 216 may be implemented as a class A linear amplifier with differential input, the details of which are illustrated in the prior art FIG. 1A, and described above, and is used as an error amplifier. The comparator 216 (hereinafter error amplifier 216) controls the overall gain of the switching power amplifier 200, its DC-offset output, frequency response, and compensates for possible errors such as crossover distortions introduced by transistors Q1 and Q2 of the constant switching current source and voltage level translator 214.

The output of the error amplifier 216 at point 11 (an exemplary non-limiting waveform of which is illustrated in FIG. 3(B)) is inverted and coupled with a base $Q1_{Base}$ of a first transistor Q1 and a base $Q2_{Base}$ of a second transistor Q2 of the constant switching current source and voltage level translator 214 by a first impedance R3. It would be appreciated by those skilled in the art that the inverting of the main input signal 208 is optional. That is, the circuit topography of the switching power amplifier 200 may easily be reconfigured so to use the non-inverted terminal of the error amplifier 216 instead, which would generate a non-inverted signal at point 11. The impedance R3 forms a part of the regulator 218, and functions as a current limiter, preventing current from flowing back into the error amplifier 216, and for maintaining constant current through the constant switching current source and voltage level translator 214.

Figure 4:
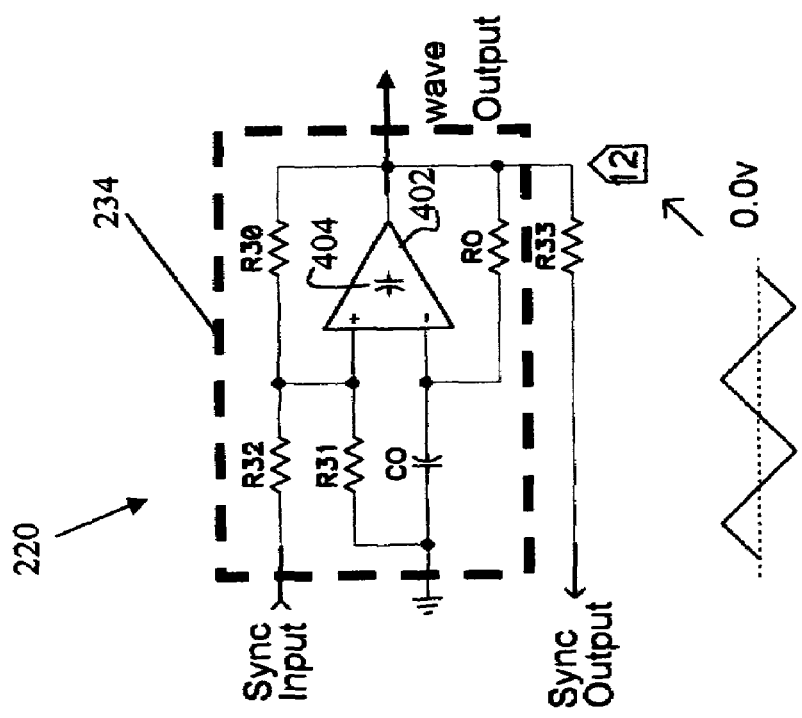
FIG. 4 is an exemplary detailed schematic illustration of the slope generator in accordance with the present invention.

The slope generator 220 illustrated in FIGS. 2A and 2B of the present invention is comprised of a single stage oscillator 234, which provides the modulation frequency for the switching power amplifier 200. FIG. 4 is an exemplary detailed schematic illustration of the slope generator 220. Referring to FIG. 4, the oscillator 234 includes at least a first impedance C0 and a second impedance R0 coupled in series, and coupled with a first terminal (negative) of an operational amplifier 402. In general, most operational amplifiers such as the operational amplifier 402 have an internal stray capacitance 404. The present invention uses this internal stray capacitance 404, the parametric value of which is based on the manufacturer specification of the operational amplifier 402, to determine and calculate the component values (in particular for R0 and C0) to generate a sloped signal (e.g., the triangular waveform) at point 12 using only one operational amplifier 402 (a single stage). In other words, the present invention takes advantage of the inherent, internal stray capacitance 404 of the operational amplifier 402 to enable the oscillator 234 to oscillate at a high frequency over a slew rate, which is calculated based on the specifications for the internal stray capacitance 404 provided by the IC manufacturer of the operational amplifier 402. Therefore, the parameters for the first impedance C0 and the second impedance R0 are determined or calculated by the present invention to have values that are commensurate with the internal stray capacitance 404 of the operational amplifier 402. This generates a linearly sloped wave signal at the output point 12 of the slope generator 220, instead of a square wave. A non-limiting exemplary waveform at point 12 is illustrated in FIG. 3(C). Therefore, in a single stage, the present invention produces the same waveform as the prior art, with the prior art producing the same triangular waveform using two stages. The present invention has therefore eliminated the need or the requirement for a two-stage oscillator to produce a triangular wave. In addition, it should be noted that the error amplifier 216 and the slope generator 220 could now be produced as a single integrated circuit, built on a dual IC operational amplifier chip.

As further illustrated in FIG. 4, the oscillator 234 is further comprised of resistors R32, R30, and R31 forming a Sync Input line, and the resistor R33, which forms the Sync Output line. The Sync Input and the Sync Output are input/output lines that are used by the present invention for multi-channel amplifiers that can be connected in a synchronized mode to synchronize each other in order to cancel frequency beating.

Referring back to FIGS. 2B and 2C, the output at point 12 of the slope generator 220 is coupled with the base $Q1_{Base}$ of the first transistor Q1 and the base $Q2_{Base}$ of the second transistor Q2 of the constant switching current source and voltage level translator 214 by a second impedance R4. The impedance R4 forms a part of the regulator 218, and functions as a current limiter, preventing current from flowing back into the slope generator 220, and for maintaining constant current through the constant switching current source and voltage level translator 214.

As illustrated in FIGS. 2B and 2C, the switching power amplifier 200 is further comprised of the regulator 218, which includes one or more clamping devices (Zener diodes Dz1 and Dz2 illustrated in FIG. 2B, and diodes D1 to D4 illustrated in FIG. 2C) for maintaining constant voltage across the constant switching current source and voltage level translator 214. Further included with the regulator 218 are impedances in the form of exemplary resistors R3 and R4, which function as current limiters. The output of the regulator 218 at point 13 is coupled with the constant switching current source and voltage level translator 214.

As further illustrated in both FIGS. 2B and 2C, the present invention further includes the constant switching current source and voltage level translator 214, which is comprised of a first constant switching current source and voltage level translator 230 coupled with a first rail # 1 having a first polarity. In addition, the constant switching current source and voltage level translator 214 further includes a second constant switching current source and voltage level translator 232 couple with a second rail #2 having a second polarity. The first constant switching current source and voltage level translator 230 is comprised of the first NPN transistor Q1 having a first terminal $Q1_{Base}$ coupled with the regulator 218 at point 13, a second terminal $Q1_{Collector}$ coupled with a first polarity impedance R8, and a third terminal $Q1_{Emitter}$ coupled with a second impedance R5. As further illustrated, the second constant switching current source and voltage level translator 232 is comprised of the second PNP transistor Q2 having a first terminal $Q2_{Base}$ coupled with the regulator 218 at point 13, a second terminal $Q2_{Collector}$ coupled with a second polarity impedance R7, and a third terminal $Q2_{Emitter}$ coupled with a third impedance R6. The second impedance R5 and the third impedance R6 are coupled with ground. In general, the polarity impedances R8 and R7 generate a constant voltage required to drive the buffers 240 and 242, and impedances R5 and R6 function to generate a constant current values for the buffers 240 and 242. As illustrated and further described below, the circuit topography of the constant switching current source and voltage level translator 214 is configured as a modified improvement of a linear amplifier (illustrated in the prior art FIG. 1B) by the addition of the impedances R5 and R6.

During operation, the NPN transistor Q1 conducts or amplifies only the first polarity side of the signal from the summing point 13, and the PNP transistor Q2 conducts or amplifies the second polarity side of the signal from the summing point 13. The high frequency signal from the slope generator at point 12 (the first polarity at this point) coupled with the constant switching current source and voltage level translator 214 via R4 at point 13, results in a first polarity square wave output on the collector $Q1_{Collector}$ of transistor Q1 at point 16 (a non-limiting exemplary waveform of which is illustrated in FIG. 3(F)). The collector $Q2_{Collector}$ of the transistor Q2 generates the second polarity square wave at point 17 (a non-limiting exemplary waveform of which is illustrated in FIG. 3(G)), with the transistors Q1 and Q2 conducting alternatively.

The regulator 218, through the clamping devices (diodes D1 to D4 or the Zener diodes Dz1 and Dz2) regulates the voltages across the constant switching current source and voltage level translator 214, regardless of the power source fluctuations on Rail #1 and Rail #2. In particular, with respect to diodes D1 and D2 of FIG. 2B and Zener diode Dz1 of FIG. 2C for the first polarity cycle, these clamping devices clamp input from the slope generator 220 to a voltage level dictated by the number and type of clamping devices used. In the exemplary case of diodes D1 and D2 of FIG. 2C, it may be an exemplary voltage level of 1.2 volts (at point 13). Hence, the voltage across the clamping devices of the regulator 218 is clamped to fixed value. This generates a constant current through the second impedance R5. That is, using Kickoff's Voltage Law (KVL), the voltage across the base-emitter junction of the transistor Q1 plus the voltage across the second impedance R5 must equal to that of the voltage across the clamping devices. Placing of a constant voltage across the second impedance R5 generates a constant current level through the second impedance R5 at point 15 (a non-limiting exemplary waveform of which is illustrated in FIG. 3(E)). This generates a pulsed current source that is constant, regardless of the power supply perturbations, which also maintains a constant current through and a constant voltage across the first polarity impedance R8, providing constant pulsed voltage across gate driver 240, which drives the power output stage P-channel MOSFET Q3.

During the second polarity cycle, the clamping devices (Zener diode Dz2 illustrated in FIG. 2B and diodes D3 and D4 illustrated in FIG. 2C) clamp input from the slope generator 220 to a voltage level dictated by the number and type of clamping devices used. In the exemplary case of diodes D3 and D4 of FIG. 2C, it may be an exemplary voltage level of −1.2 volts (at point 13). Hence, the voltage across the clamping devices of the regulator 218 is clamped to fixed value. This generates a constant current through the third impedance R6. That is, using Kickoff's Voltage Law (KVL), the voltage across the base-emitter junction of the transistor Q2 plus the voltage across the third impedance R6 must equal to that of the voltage across the clamping devices. Placing of a constant voltage across the third impedance R6 generates a constant current level through the third impedance R6 at point 14 (a non-limiting exemplary waveform of which is illustrated in FIG. 3(H)). This generates a pulsed current source that is constant, regardless of the power supply perturbations, which also maintains a constant current through and a constant voltage across the second polarity impedance R7, providing constant pulsed voltage across gate driver 242, which drives the power output stage N-channel MOSFET Q4.

It should be noted that output modulations can be shut off by grounding the summing point 13 by a mute or ON/OFF switch 244, which provides the power output stage with a three-state mode operation, and when OFF, sets the power output stage 222 to high impedance (no switching at all). The switch 244 may also be used as protection circuit, Mute, anti-POP noise, etc.

Figure 5:
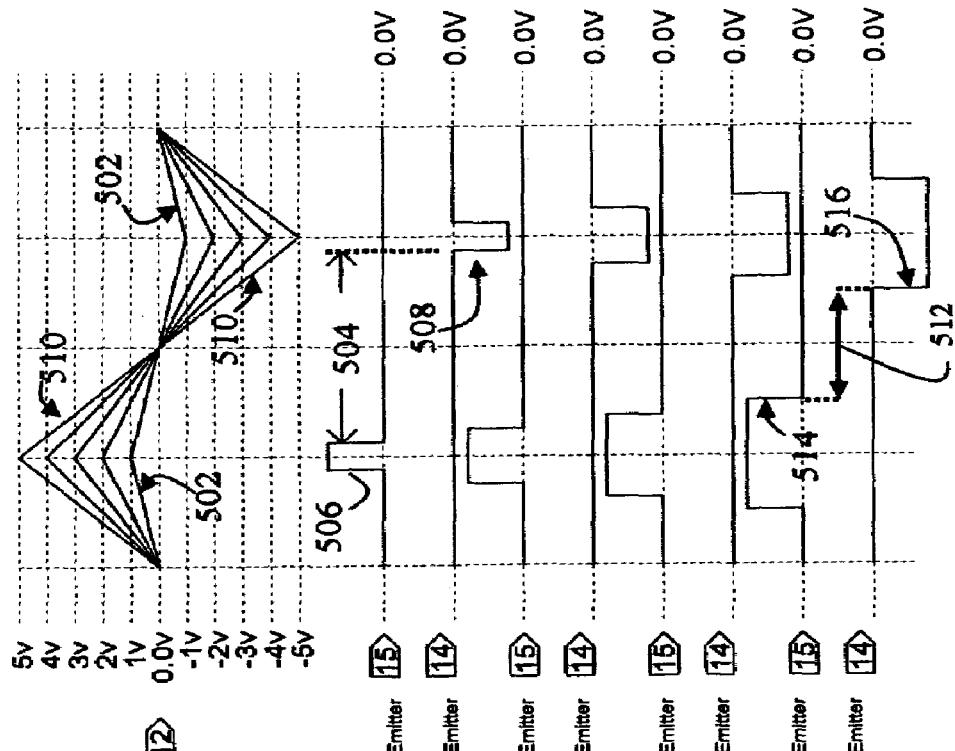
FIG. 5 is an exemplary waveform diagram, which illustrates the dead times between various transistors in accordance with the present invention.

It should further be noted that the modulated signal outputs of transistors Q1 and Q2 also depend on the triangular waveform generated by the slope generator 220 at point 12. As best illustrated in FIG. 5, a low amplitude waveform 502 will generate a longer duration "dead time" 504 between the output 506 of the transistor Q I and the output 508 of the transistor Q2. On the other hand, a high amplitude waveform 510 will generate a shorter duration "dead time" 512 between the output 514 of the transistor Q I and the output 516 of the transistor Q2. The actual waveform outputted by the transistor Q1 is at point 16, and that of transistor Q2 is at point 17. Accordingly, the dead time generated by the constant switching current source and voltage level translator 214 may be controlled by variation of the amplitude of the signal at point 12 of the oscillator 234. In most cases, dead time is desired in order to avoid cross-conduction between output of the MOSFETS Q3 and Q4 of the power output stage 222, at point 18 (a non-limiting exemplary waveform of which is illustrated in FIGS. 3(I), (J), and (K)). Accordingly, the present invention is capable of handling most (if not all) types of class D type power output stages by merely controlling the dead times.

Referring back to FIGS. 2B and 2C, when there is no input signal 208 at point 10, the voltage from error amplifier 216 at point 11 is 0.0 volts. Therefore, transistors Q1 and Q2 bases voltages at point 13 are triggered with a 50% duty cycle from the triangular wave generated by the slope generator 220 at point 12. When output from the error amplifier 216 at point 11 fluctuates to a first polarity (e.g., a positive high), transistor Q1 is triggered first, and then the transistor Q2, having as results a positive pulse width modulation on Q1-collector at point 16. The opposite occurs when the error amplifier 216 fluctuates to a second polarity (e.g., a negative high). That is, when output from the error amplifier 216 at point 11 fluctuates to a second polarity, transistor Q2 is triggered first, and then the transistor Q1, having as result a negative pulse width modulation on Q2-collector at point 17.

As described above, the error amplifier 216, slope generator 234, regulator 218, and the constant switching current source and level translator 214 when combined, function as the modulator 202, which provides a constant current source and voltage pulses to drive the output stage 204, eliminating the need for the prior art proprietary IC Switch Control Driver 180 and a power supply regulator. Instead, off-the-shelf products are used to manufacture the modulator 202 for driving the output stage 204.

The present invention provides a circuit that has no bias current, and therefore no cross conductions. The modulator 202 of the present invention functions as a current source, having always a constant amplitude output across the first polarity impedance R8 or the second polarity impendence R7. The modulator 202 is further able to tolerate substantial voltage variations across the rails, with its pulse outputs varying in accordance to the fluctuations levels from the error amplifier 216 at point 11. In addition, the modulator 202 is further easily shut down by grounding the bases of transistors Q1 and Q2. An added advantage of the modulator 202 is that the clamping devices used within the modulator 202 also compensate for the Base-Emitter voltage for temperature variations at point 13.

As further illustrated in FIGS. 2B and 2C, the switching power amplifier 200 includes the power output stage 204 that is comprised of one or more buffer-derivers 240 and 242 for operating the respective one or more output power transistor switches Q3 and Q4 that provide high frequency current at point 18. The gating at the output of the buffers 240 and 242 connect in parallel the MOSFETS Q3 and Q4 to lower the output impedance of the switching power amplifier 200, and provide higher, scalable output power. In other words, the square outputs from Q1 and Q2 are coupled with the output stage 222, wherein the gate buffer drivers 240 and 242 provide current gains to drive gate MOSFETS Q3 and Q4. This means that the switching output at point 18 is complementary waveform of the outputs from the constant current source and voltage level translator 214. In addition, the power output stage 204 further includes the recovery circuit 224 for filtering a high frequency component of the current for outputting the main output signal 210 for driving the load 212. The recover circuit 224 is comprised of two LC circuits, having components L1, L2, C1, and C2, configured as a fourth order filter demodulator that removes the modulated component from the waveform at point 18, leaving only the amplified outputs at points 19 and 20 (a non-limiting exemplary waveforms of which are respectively illustrated in FIGS. 3(M) and (N)).

The feedback module 206 of the switching power amplifier 200 is comprised of a feedback unit 226 and a resonant load unit 228. The feedback unit 226 is comprised of an LC output feedback control 246 and a switching feedback control 248, which are coupled between the power output stage 204 and the modulator 202 for removal of input signal distortions and maintaining of overall signal gain for the switching power amplifier 200. The feedback module 206 further includes the error amplifier feedback 250, comprised of the series coupled capacitor C20, resistor R25, and resistor R1, and functions to maintain stability between the main input signal 208 and the main output signal 210. The error amplifier feedback 250 maintains stability by neutralizing or canceling inherent parasitic oscillations that may occur. The error amplifier feedback 250 also maintains the overall gain between the main input signal 208 and the main output signals 210, and maintains low distortions at the main output signal 208.

As illustrated, the error amplifier 216 is connected as an integrator or differentiator consecutively to lag or lead the phase as needed, with the purpose of maintain always the phase shift within exemplary 0° and −180°, as far is possible of 180°0 line (point of oscillation). The switching feedback control 248 includes impedances R9 and R10 that form a voltage divider, and include a capacitor C3 and impedances R11 and R20 for filtering the switching frequency output, leaving only the amplified output signal divided by voltage divider R9 and R10. The impedances C3 and R11 serve to compensate the phase angle of an exemplary negative 90° phase shift caused by the error amplifier 216.

In addition to the switching feedback 248, the feedback unit 226 further includes the LC output feedback control 246 that functions as a phase lag compensation circuit for modifying phases of the main output signal 210 in relation to that of the main input signal 208 for avoiding oscillations. It should be noted that a feedback loop may oscillate because output at point 19 of the L1 and C1 filter has a phase shift lag of up to −180°, and the error amplifier 216 is an inverter that also shifts the phase additionally to −180°. Thus, a −180° phase shift by the L1 and C1 filter, plus a −180° from the error amplifier 216 results in a −360° phase, which is the perfect formula for an oscillator circuit. Therefore, some method must be used to maintain the phase above the −180° line to avoid oscillations and preserve the circuit stability under the frequency domain, until the transfer function is sloped down and crosses the 0 dB (below the unit gain). Of course, the method must also preserve or save the required bandwidth intact. The LC output feedback control 246 is therefore used to neutralize the phase of the output signal, which may have a phase shift of 90° at resonance point caused by the L1 and C1 filter demodulator of recover circuit 224 (negative 180° at L2 and C2). That is, the LC output feedback control 246 neutralizes the possible phase shift of 90° at resonance point by introducing a phase lag of approximately 45° for maintaining stability. Both the switching feedback control 248 and the LC output feedback control 246 of the present invention provide unique characteristics of low distortion and a high damping factor. Resonant load circuit 228, which is comprised of a series coupled resistor R24 and capacitor C21, functions to maintain a low Q factor for the output LC filter when a load is removed.

Figure 6:
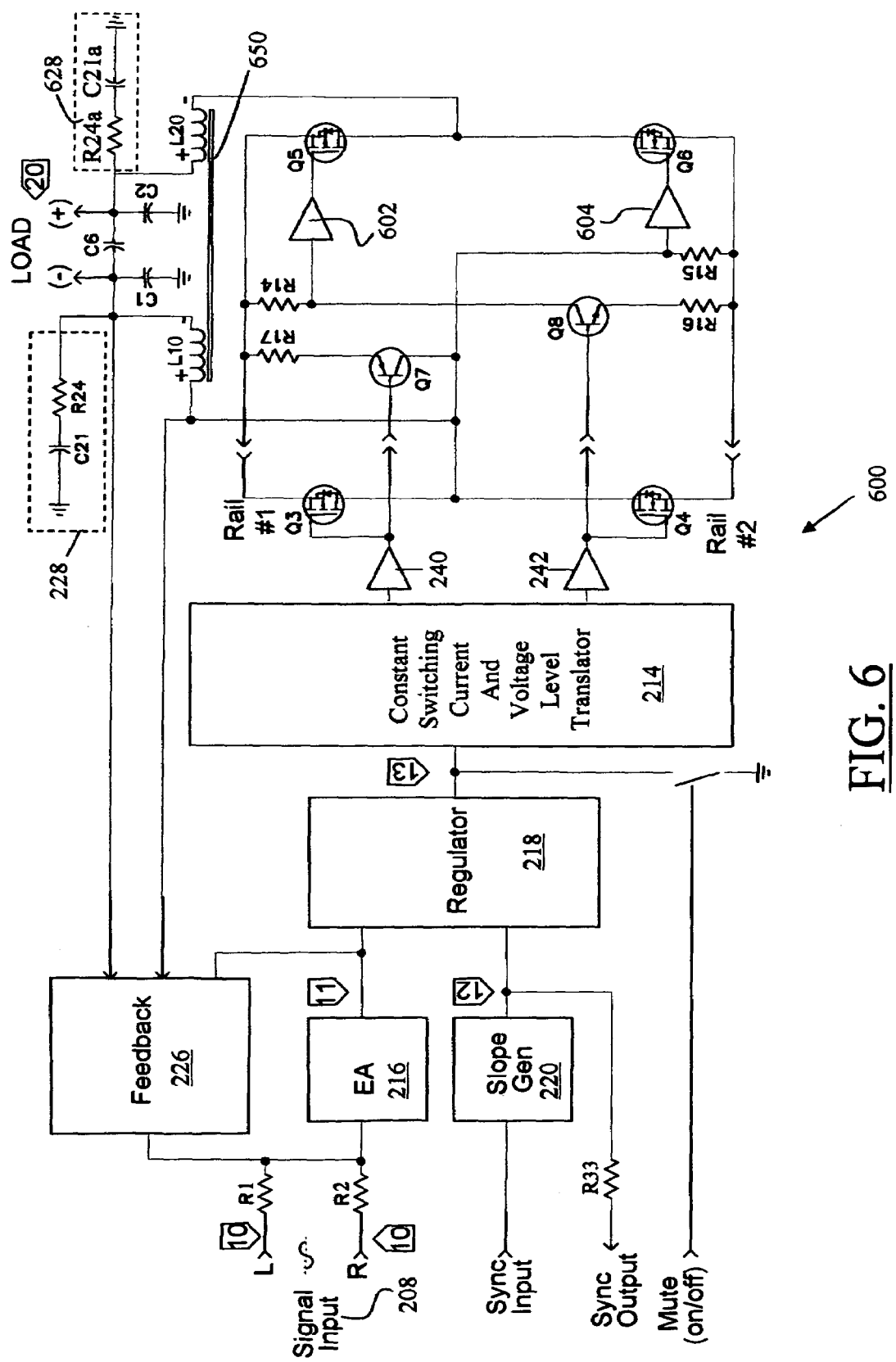
FIG. 6 is an exemplary illustration of a switching power amplifier with a full bridge power output stage configuration in accordance with the present invention.

FIG. 6 is an exemplary illustration of a switching power amplifier 600 that includes the same corresponding or equivalent components as the switching power amplifier 200 that is shown in FIGS. 2A to 5, and described above, but with a full bridge power output stage configuration. Therefore, for the sake of brevity, clarity, and convenience the general description of FIG. 6 will not repeat every corresponding or equivalent component that has already been described above in relation to the switching power amplifier 200 that is shown in FIGS. 2A to 5.

As illustrated in FIG. 6, switching power amplifier 600 includes a full bridge power output stage that is a mirror image (or opposite in polarity) of the output stage of the switching power amplifier 200, which is a half bridge. The full bridge topography includes additional drivers 602 and 604 for driving a respective second pair of MOSFETS Q5 and Q6. The MOSFETS Q5 and Q6 operate in an opposite polarity to those of the first pair of MOSFETS Q3 and Q4 (illustrated in FIGS. 2B and 2C). The transistors Q7 and Q8 are coupled with the respective buffers 240 and 242, and function to generate the mirror image (or opposite polarity) of what is being output by the buffers 240 and 242. In addition, the transistors Q7 and Q8, like those of transistors Q1 and Q2 illustrated in FIGS. 2B and 2C, function as constant switching current and voltage level translators, but in opposite polarity.

The impedances R17 and R16 have similar functionality to those of impedances R5 and R6 of FIGS. 2B and 2C, functioning to generate a constant current value, and the polarity impedances R14 and R15 have similar functionality to those of polarity impedances R8 and R7 of FIGS. 2B and 2C. That is, the polarity impedances R14 and R15 function to generate a constant voltage, which is required to drive the buffers 602 and 604. Therefore, constant switching currents drive the full bridged outputs Q5 and Q6 with waveforms illustrated in FIGS. 3A to 3N, but in opposite polarity (mirror image) having a full bridge output configuration.

As further illustrated, the inductors L10 and L20 function the same way as those of inductors L1 and L2 of FIGS. 2B and 2C, however, the inductors L10 and L20 may optionally be configured on the same magnetic core 650. The windings L10 and L20 are magnetically in series with the same polarity and the same number of turns, and are wound bifilarly. The use of a single magnetic core 650 lowers the cost of the full bridge power output stage. In addition, compared with traditional conductors, using a single core 650 also reduces switching noise, and lower emissions of electro magnetic interferences (EMI) that are generated. Unlike FIGS. 2B and 2C, the used of two magnetically coupled inductors on a single core 650 requires the use of an additional resonant load circuit 628, which is comprised of impedances R24a and C21a, which function the same as the resonant load circuit 228.

Figure 7:
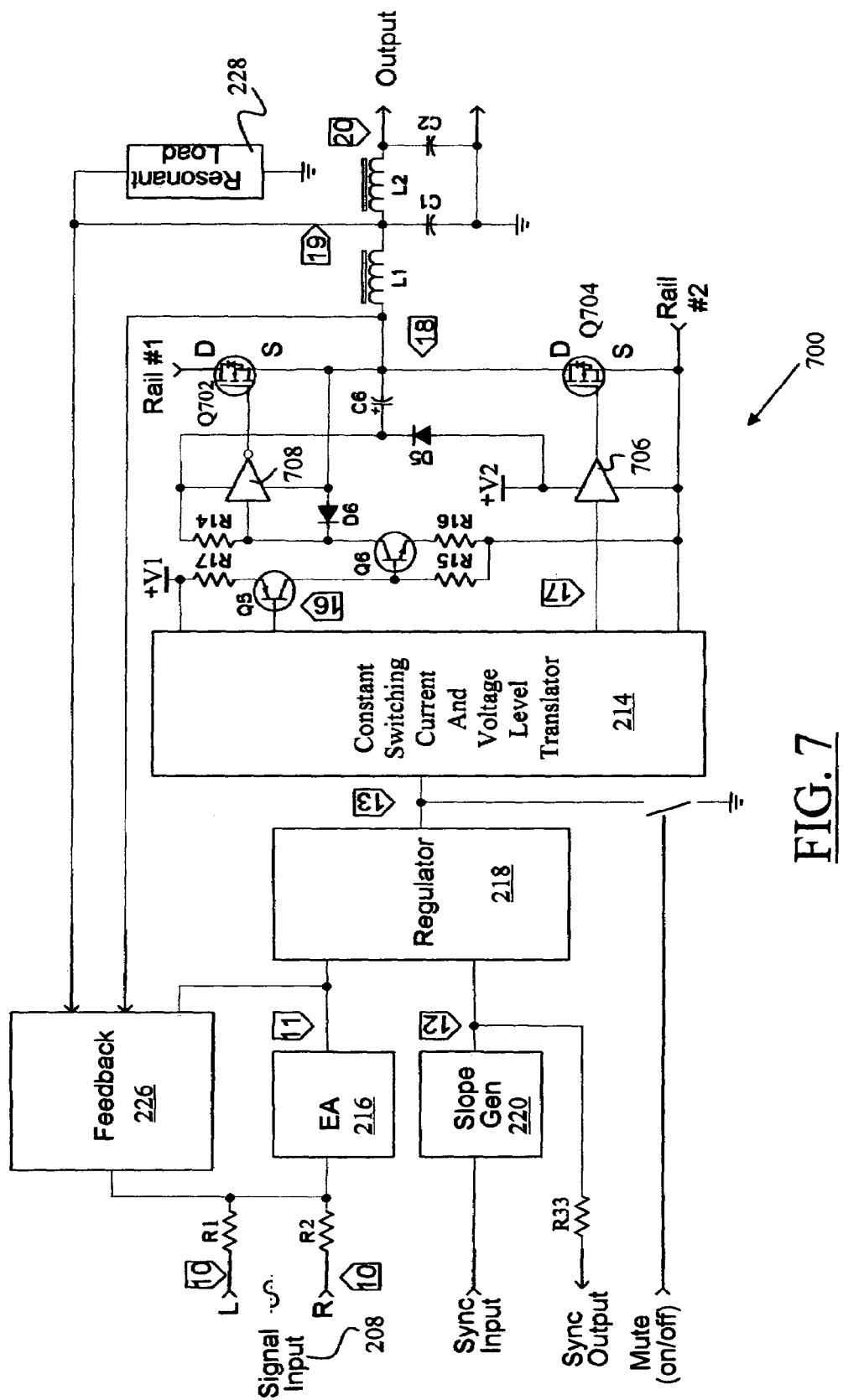
FIG. 7 is an exemplary illustration of a switching power amplifier with a half bridge bootstrap power output stage configuration in accordance with the present invention.

FIG. 7 is an exemplary illustration of a switching power amplifier 700 that includes the same corresponding or equivalent components as the switching power amplifier 200 that is shown in FIGS. 2A to 5, and described above, but with a half bridge bootstrap power output stage configuration topography. Therefore, for the sake of brevity, clarity, and convenience the general description of FIG. 7 will not repeat every corresponding or equivalent component that has already been described above in relation to the switching power amplifier 200 that is shown in FIGS. 2A to 5.

Bootstrap circuit is a well-known circuit configuration that can drive switches with only a single supply (e.g., +V2) coupled with one of the two polarity rails (e.g., Rail #2) of a circuit. As illustrated in FIG. 7, the use of bootstrap circuit enables the use of two N-channel MOSFETs Q702 and Q704 instead of the combination of P and N channel MOSFETs illustrated in FIG. 2A to 2C. Using a mix of P and N channel MOSFETs requires that the characteristics of the MOSFETs be matched, and further, increases the overall cost of the circuit because P-channel MOSFETs are more expensive and difficult to produce. One non-limiting example of a MOSFET characteristic that requires matching is the well-known Resistance between Drain and Source when both switches are ON (also known as RDS-ON). However, the disadvantage of using the bootstrap circuit configuration is the use of an additional power supply on the negative rail. Although this may be more expensive and require more parts, it may be worth it for very high power amplifier applications.

The signal amplification process for the circuit of FIG. 7 is similar to the previously described circuit topographies of FIGS. 2A to 5, except that in FIG. 7, the transistor Q5 is a level translator toward the negative Rail #2. When the transistor Q2 drives the buffer 706 high, MOSFET Q704 is gated ON. Under this condition, diode D5 is forward biased, and the current through the diode D5 charges the capacitor C6 from the auxiliary power supply +V2, which is applied onto the negative rail (Rail #2). At this period, transistors Q5 and Q6 are OFF, thus the high side buffer 708 and the MOSFET Q702 are OFF. During the next cycle of the signal, the transistor Q5 is gated ON, which, in turn, switches ON the transistor Q6, but with a constant current settled by the impedances R15 and R16. The ON condition of the transistor Q6 drives the high side buffer 708, which gates the transistor Q702 to ON condition, while Q704 remains open (OFF). In addition, during this cycle, the diode D5 is in reversed biased condition (no current is being conducted by the diode, functioning as an open circuit), and the accumulated charge within C6 is floated (discharged or drained) into MOSFET Q702 and buffer 708, providing the necessary voltage for gating ON the MOSFET Q702, while MOSFET Q704 is in OFF state. The accumulated charge from the capacitor C6 is also supplied to the switching output at point 18. With this technique, voltage that supplies the high side buffer 708 is dynamically floating from negative rail via the capacitor C6, forming a phantom power supply for the high side buffer 708 via the diode D5 and capacitor C6, by the art of utilizing the switching periods ON/OFF times of MOSFET Q704.

When a dead time is present or Mute (ON/OFF line) is activated, the transistors Q1 and Q2 are opened (OFF), therefore the transistors Q5 and Q6 are opened (OFF) as well, which accordingly, turn OFF MOSFETS Q702 and Q704. This leaves the output stage in high impedance, with no switching, similar to the circuit configurations illustrated in FIGS. 2A to 5.

Figure 8:
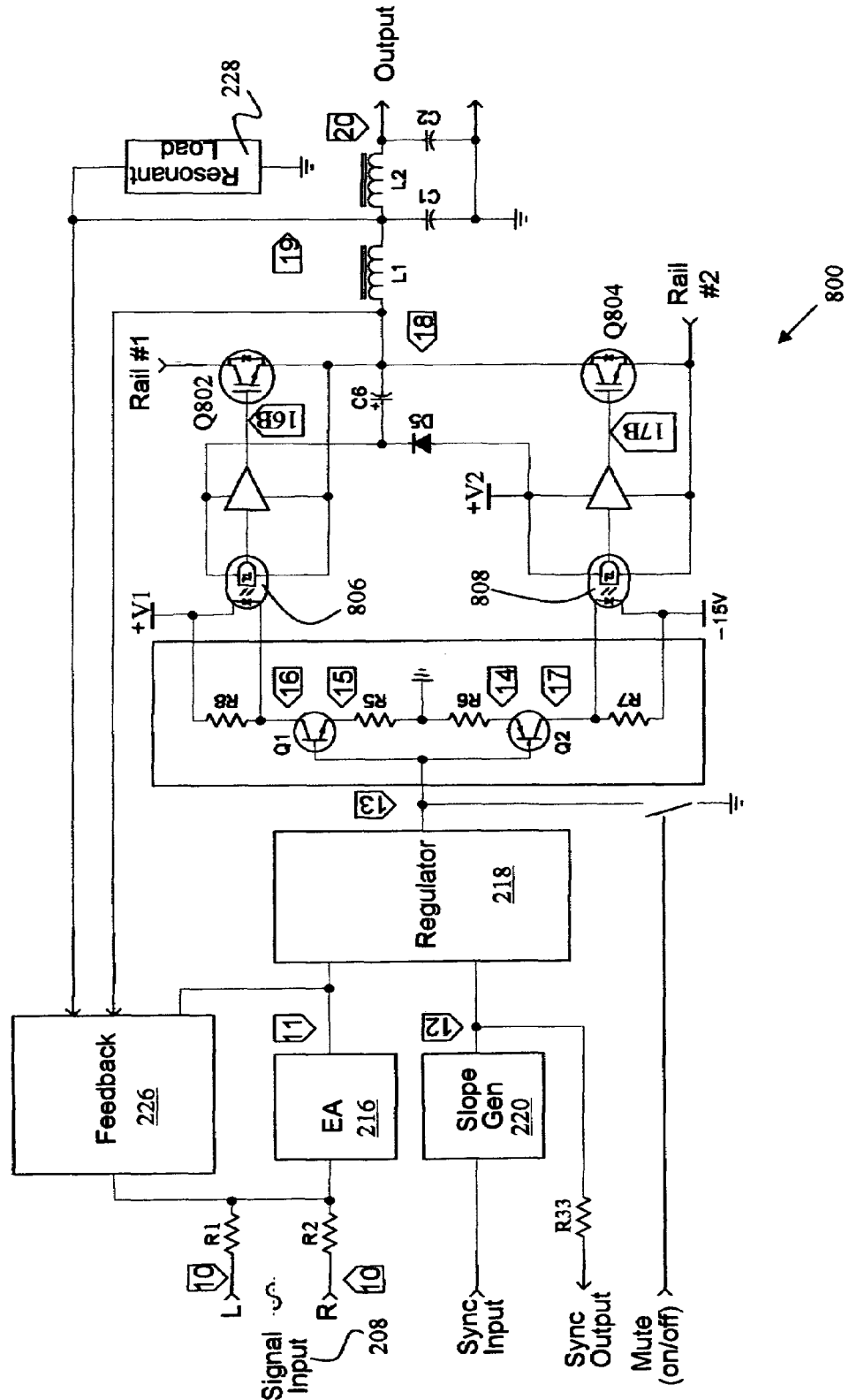
FIG. 8 is an exemplary illustration of a switching power amplifier using opto-coupler drivers and IGBT power switches in accordance with the present invention.

FIG. 8 is an exemplary illustration of a switching power amplifier 800 that includes the same corresponding or equivalent components as the switching power amplifier 200 that is shown in FIGS. 2A to 5, and the bootstrap circuit configuration 700 of FIG. 7. However, the switching power amplifier 800 illustrated in FIG. 8 uses opto-coupler drivers and IGBT power switches. Therefore, for the sake of brevity, clarity, and convenience the general description of FIG. 8 will not repeat every corresponding or equivalent component that has already been described above in relation to the switching power amplifier 200 that is shown in FIGS. 2A to 5, and the bootstrap circuit configuration 700 that is shown in FIG. 7.

The circuit configuration 800 is applicable for low frequency amplifiers, in particular, high power amplifiers of general use in the exemplary range of more than 10 Kilowatts. One of the main advantage for using opto-couplers is that they isolate the modulator 202 from high voltage and heavy currents of the power output stage. The functionality of the FIG. 8 circuit configuration 800 is similar to that, which is described above in relation to FIG. 7, except that IGBTs Q802 and Q804 are used instated of the two N-channel transistor Q702 and Q704. In addition, the IGBTs Q802 and Q804 are driven by the opto-couplers 806 and 808.

Figure 9:
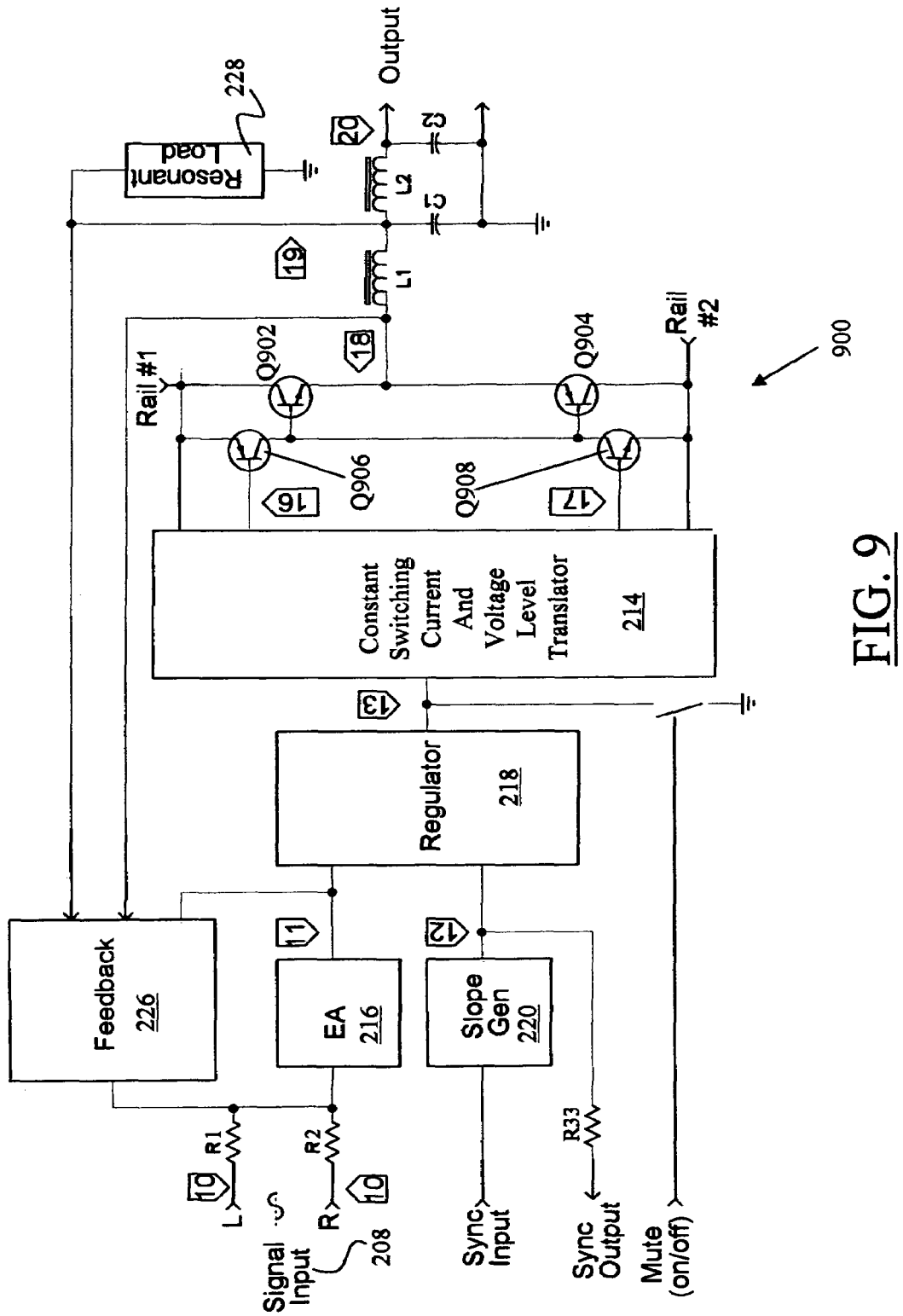
FIG. 9 is an exemplary illustration of a switching power amplifier using Bipolar Junction Transistors in accordance with the present invention.

FIG. 9 is an exemplary illustration of a switching power amplifier 900 that includes the same corresponding or equivalent components as the switching power amplifier 200 that is shown in FIGS. 2A to 5, and described above, but using Bipolar Junction Transistors instead of MOSFETs. Therefore, for the sake of brevity, clarity, and convenience the general description of FIG. 9 will not repeat every corresponding or equivalent component that has already been described above in relation to the switching power amplifier 200 that is shown in FIGS. 2A to 5.

The circuit configuration 900 of FIG. 9 is best suited for applications involving lower frequency operations because the BJTs cannot switch as fast as MOSFETs. Therefore, circuit configuration 900 is more appropriate for low frequency amplifier applications. One of the main benefits of using BJTs for low frequency operations are their lower price compared to MOSFETs. As with FIGS. 2A to 5, the signal amplification process of FIG. 9 is the same as the previously described FIGS. 2A to 5. That is, the NPN BJT Q906 drives the PNP BJT Q902, and NPN BJT Q908 drives the PNP BJT Q904.

Figure 10A:
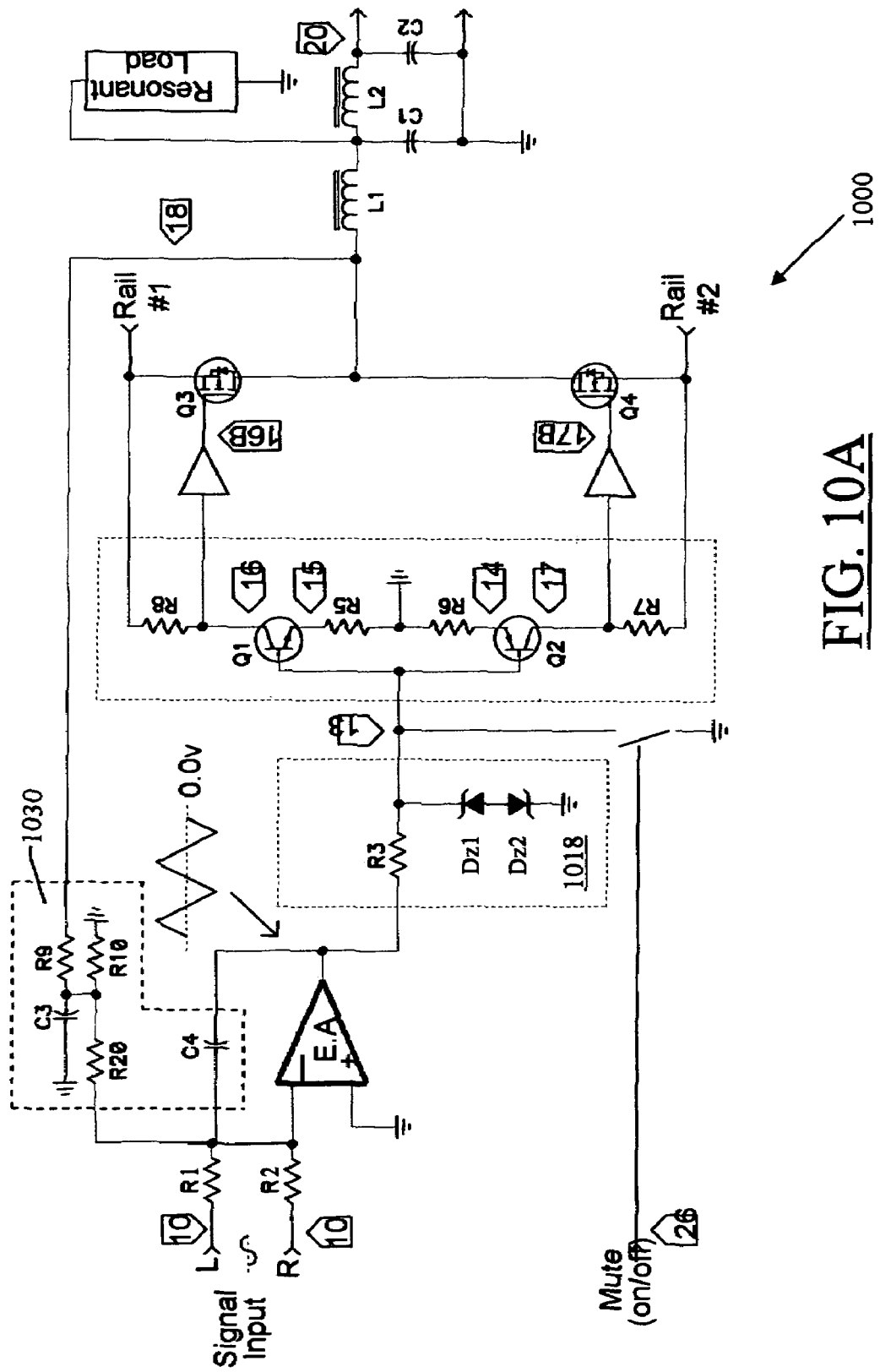
FIGS. 10A and 10B are exemplary illustrations of a self-oscillating switching power amplifier in accordance with the present invention.
Figure 10B:
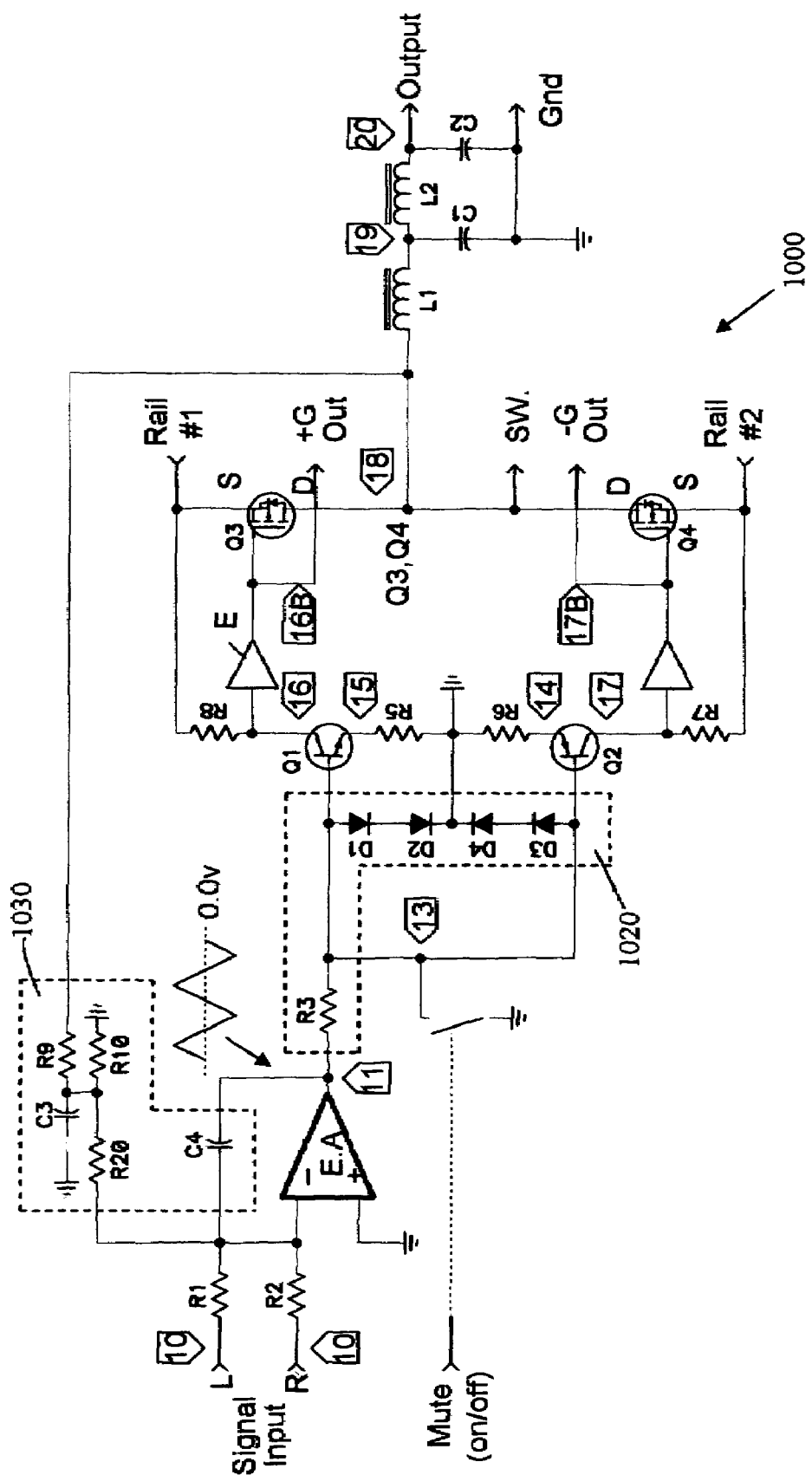

FIGS. 10A and 10B are exemplary illustrations of a self-oscillating switching power amplifiers 1000 that include the same corresponding or equivalent components as the switching power amplifier 200 that is shown in FIGS. 2A to 5, and described above, but without the use of slope generator. Therefore, for the sake of brevity, clarity, and convenience the general descriptions of FIG. 10A and 10B will not repeat every corresponding or equivalent component that has already been described above in relation to the switching power amplifier 200 that is shown in FIGS. 2A to 5. It should be noted that FIG. 10A is an exemplary illustration of one embodiment where the regulator 1018 includes the use of Zener diodes Dz1 and Dz2, whereas FIG. 10B shows the use of regular 1020 using diodes D1 to D4. In fact, any well-known clamping devices, including transistor switches configured as clamping devices may be used. Otherwise, the circuit configurations illustrated in FIGS. 10A and 10B are identical and hereinafter, are referred to as self-oscillating switching power amplifier 1000. Although illustrated as a half-bridge configuration, a full bridge configuration of a self-oscillating switching power amplifier 1000 is also possible, similar to those presented.

The signal amplification process for the self-oscillating switching power amplifier 1000 is substantially the same as the switching power amplifier 200 illustrated in FIGS. 2A to 5. However, the difference between circuit configurations 1000 and 200 is that the self-oscillating power amplifier 1000 is self-oscillating, and does not require a slope generator. That is, it uses a phase-lag oscillation circuit 1030 to generate a frequency used for switching operations of the circuit 1000. The components values of the phase-lag oscillation circuit 1030 (R9, R10, R20, C3 and C4) determine the switching frequency for the oscillation. Although the self-oscillating switching power amplifier configuration is inexpensive compared to those circuit configurations illustrated in FIGS. 2A to 5, one disadvantage is that the frequency of oscillation changes when modulation occurs. That is, the frequency of oscillation can vary greatly, a non-limiting example of which may include exemplary variations of up to 10 times the fixed frequency when the input signal duty cycle is modulated up to an exemplary value of 90%.

The phase-lag oscillation circuit 1030 functions very similarly to that of the switching feedback control 248. However, the phase-lag oscillation circuit 1030 does not include the additional resistor R11 found in the switching feedback control 248. Hence, the phase-lag oscillation circuit 1030, just as the switching feedback control 248 includes the impedances R9 and R10 that form a voltage divider, and includes a capacitor C3, which in combination with the impedance R9 produce a delay in phase by −90 degrees. Therefore, removing the resistor R11 provides the additional phase lag of −90 degrees. Further, the combination of impedances R20 and C4 provide for an addition of −90 degrees for a total of −180 degrees, which in combination with the −180 degrees phase shift generated by the error amplifier 216, provides a total of −360 degrees phase, which is the frequency (or formula) for oscillation circuit.

Figure 11:
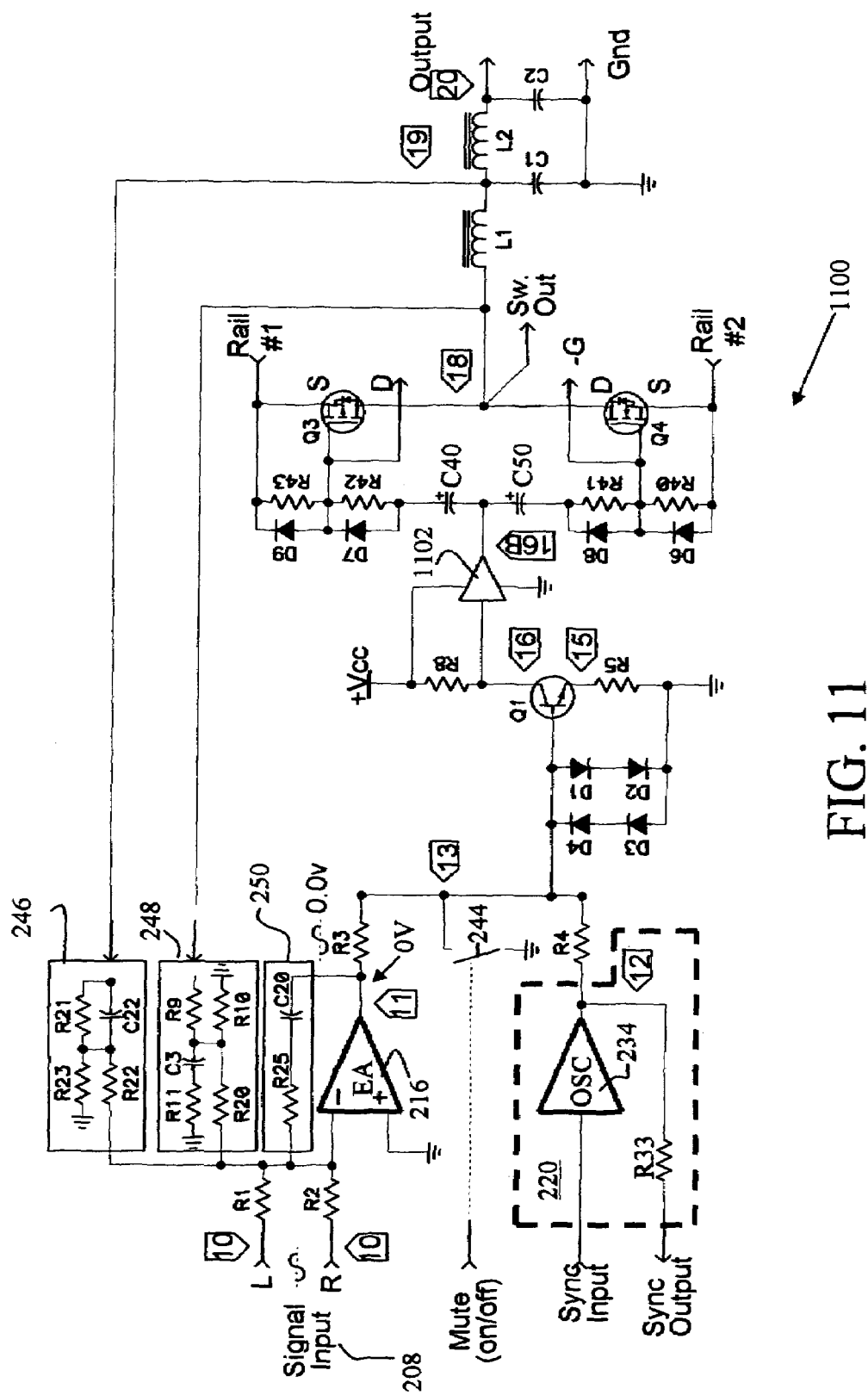
FIG. 11 is an exemplary illustration of a capacitive coupling switching power amplifier in accordance with the present invention.

FIG. 11 is an exemplary illustration of a capacitive coupling switching power amplifier 1100 that includes the same corresponding or equivalent components as the switching power amplifier 200 that is shown in FIGS. 2A to 5, and described above, but using capacitive output circuit configuration. Therefore, for the sake of brevity, clarity, and convenience the general description of FIG. 11 will not repeat every corresponding or equivalent component that has already been described above in relation to the switching power amplifier 200 that is shown in FIGS. 2A to 5.

As illustrated in FIG. 11, only one of the two constant switching current and voltage level translators (in this instance the negative polarity) is used, which would require only one driver 1102. Of course, the positive polarity portion of the constant switching current and voltage level translators may be used instead. One application of this circuit configuration illustrated is that it may be used for higher frequency applications, in particular, for full band amplifiers. However, due to the use of capacitors, if the main input signal 208 is a Direct Current (DC) signal, circuit 1100 would not respond. Otherwise, the functionality of the circuit illustrated in FIG. 11, is substantially the same as those described in relation to FIGS. 2A to 5, with the exception that the power switching transistors Q3 and Q4 are capacitive driven.

One of the main advantages of the circuit 1100 is that there is no dead time between the output stage transistors Q3 and Q4, and therefore, there is no crossover distortion at small output signals, which is similar to a class A amplifier. However, one main disadvantage is that the circuit 1100 is very sensitive to rail supply variations, having as results high ripple audible noise, which may possibly damage the output MOSFETS Q3 and Q4 under extreme conditions. This problem can be obviated by the use of regulated power supply rails.

Due to the accumulated charges on C50 and C40, these two capacitors translate the square PWM voltage levels from the buffer 1102 to the positive and negative rails, respectively. The diodes D9 and D6 clamp the PWM translated from the capacitors C50 and C40 in order to maintain a constant voltage applied to the source terminals of the transistors Q3 and Q4, respectively, hence, the capacitors C50 and C40, in combination with the diodes D9 and D6, function as a voltage translator.

During the first half cycle (e.g., positive polarity), the diode D7 is biased forward, quickly gating OFF the transistor Q3. It should be noted that the transistor Q3 is a P-channel transistor, hence, will turn OFF when a positive polarity voltage is applied to its gate. During this same cycle, the diode D8 is biased in reverse, which slowly gates ON the transistor Q4. Given that the diode D8 is reverse biased, it functions as open circuit, and hence, current is passed through the impedance R41 to the gate of transistor Q4. Accordingly, due to the impedance value of the resistor R41, the transistor Q4 is gated ON slowly. During the next opposite cycle, transistor Q4 is quickly gated OFF by the Diode D8, similar to diode D7 turning OFF the transistor Q3 in the previous cycle. During this same cycle, transistor Q3 is slowly turned ON due to the resistance from the impedance R42. The diode D7 at this cycle is reverse biased, functions as open circuit, and hence, the current moves thought the resistor R42 to gate ON the transistor Q3. With technique described, transistors Q3 and Q4 avoid cross-conduction, and the parameter values of impedances R41 and R42 are used to control the dead time between the transistors Q3 and Q4. That is, the larger the impedance values, the larger the dead time. Impedances R40 and R43 couple the gates of transistors Q4 and Q3 with the respective source terminals of transistors Q4 and Q3 when amplifier circuit 1100 is OFF. That is, zero voltage value is maintain between the gate and the source of the transistors Q3 and Q4 terminals when the amplifier circuit 1100 is OFF. It should be noted that although a half-bridge circuit topography is illustrated, a full-bridge may also be used, instead.

Although the invention has been described in considerable detail in language specific to structural features and or method acts, it is to be understood that the invention defined in the appended claims is not necessarily limited to the specific features or acts described. Rather, the specific features and acts are disclosed as preferred forms of implementing the claimed invention. Therefore, while exemplary illustrative embodiments of the invention have been described, numerous variations and alternative embodiments will occur to those skilled in the art. For example, any combination and permutation of transistors, non-limiting examples of which may include IGBTs, MOSFETs (P and/or N channel), BJTs, and so on may be used within any of the circuit configurations. Further, any combination and permutations of circuit configurations, non-limiting examples of which may include the use of half-bridge, full-bridge, bootstrap half-bridge, bootstrap full bridge, or others that are illustrated and described may be used. It should be noted that the above examples are non-exhaustive. Such variations and alternate embodiments are contemplated, and can be made without departing from the spirit and scope of the invention.

What is claimed is:

1. A switching amplifier, comprising:
   a modulator for converting a main input signal to a high frequency modulated switching signal and for providing voltage amplification of the main input signal;
   a power output stage coupled with an output of the modulator for receiving the voltage amplified main input signal and for providing a current amplification of the main input signal for providing a main output signal for driving a load; and
   a feedback module for correction of the main output signal in relation to the main input signal, with the modulator comprising:
   a constant switching current source and voltage level translator for providing constant current and voltage to the power output stage;
   a comparator coupled with an input of the constant switching current source and voltage level translator through a regulator mechanism, with the comparator comparing the main input signal with the main output signal for maintaining a linearly amplified replica of the main input signal;
   a ramp generator coupled with the input of the constant switching current source and voltage level translator through the regulator mechanism, with the ramp generator providing a modulation frequency for the switching amplifier and;
   the regulator mechanism coupled with the input of the constant switching current source and voltage level translator for regulating a voltage of the switching amplifier.

2. A switching amplifier as set forth in claim 1, wherein:
   the constant switching current source and voltage level translator is comprised of a first constant switching current source and voltage level translator having a first polarity, and a second constant switching current source and voltage level translator having a second polarity.

3. A switching amplifier as set forth in claim 2, wherein:
   the first constant switching current source and voltage level translator is comprised of a first transistor having a first terminal coupled with the regulator mechanism, a second terminal coupled with a first polarity impedance, and a third terminal coupled with a second impedance; and
   the second constant switching current source and voltage level translator is comprised of a second transistor with the second transistor having a first terminal coupled with the regulator mechanism, a second terminal coupled with a second polarity impedance, and a third terminal coupled with a third impedance.

4. A switching amplifier as set forth in claim 1, wherein:
   the constant switching current source and voltage level translator is a linear amplifier.

5. A switching amplifier as set forth in claim 4, wherein:
   the comparator is coupled with a first transistor and a second transistor of the linear amplifier by a first impedance;
   the ramp generator coupled with the first transistor and the second transistor of the linear amplifier by a second impedance.

6. A switching amplifier as set forth in claim 1, wherein:
   the comparator is comprised of a linear differential amplifier used as an error amplifier.

7. A switching amplifier as set forth in claim 6, wherein:
   the linear differential amplifier is further comprised of a buffer output stage.

8. A switching amplifier as set forth in claim 1, wherein:
   the ramp generator is comprised of:
   an operational amplifier;
   a first impedance and a second impedance coupled in series, and coupled with a first terminal of the operational amplifier, with the first impedance and the second impedance having parameters commensurate with an internal capacitance of the operational amplifier for generating a linearly sloped wave signal.

9. A switching amplifier as set forth in claim 1, wherein:
   the regulator mechanism is comprised of:
   one or more clamping devices for maintaining constant voltage across the constant current source and level translator; and
   one or more current limiters for maintaining constant current through the constant switching current source and level translator.

10. A switching amplifier as set forth in claim 1, wherein:
    the power output stage is comprised of:
    one or more buffer-derivers for operating one or more output power transistor switches that provide high frequency current; and
    a recovery circuit for filtering a high frequency component of the current for outputting the main output signal for deriving the load.

11. A switching amplifier as set forth in claim 10, wherein:
    the power output stage is a half bridge output stage.

12. A switching amplifier as set forth in claim 10, wherein:
    the power output stage is a fill bridge output stage.

13. A switching amplifier as set forth in claim 10, wherein:
    the power output stage is a half bridge bootstrap.

14. A switching amplifier as set forth in claim 10, wherein:
    the power output stage is a self-oscillating output stage.

15. A method for signal amplification, comprising the acts of:
    receiving a main input signal;
    modulating the system input signal for outputting a modulated signal;
    providing the modulated signal to a power switching stage for voltage and current amplifications of the modulated signal for driving a load; and
    recovering the main output signal by removing a modulated component for driving the load and for providing feedback signal as the output feedback signals to a feedback module with the act of modulating the system input signal comprising:

comparing the main input signal with an output signal for maintaining a linearly amplified replica of the main input signal and generating a system input signal;

providing a linearly sloped signal; and regulating the system input signal and the linearly sloped signal for providing a constant switching current and voltage to a power switching stage.

16. The method for signal amplification as set forth in claim 15, wherein:

the act of receiving the main input signal is further comprised of an act of comparing the main input signal with the output feedback signals for detection and correction of overall system signal processes.

17. The method for signal amplification as set forth in claim 15, wherein:

the act of providing the linearly sloped signal is comprised of the act of:

providing an impedance having a parameter commensurate with an internal capacitance of a signal generator for generating the linearly sloped signal.

18. The method for signal amplification as set forth in claim 17, wherein:

the impedance is selected to equal to the resonant frequency of the internal capacitance of the signal generator.

19. The method for signal amplification as set forth in claim 15, wherein:

the act of regulating the system input signal and the linearly sloped signal is comprised of:

limiting current for providing a constant system input signal and linearly sloped signal; and clamping voltage input sources for maintaining a constant voltage.

20. The method for signal amplification as set forth in claim 15, wherein:

the act of coupling the modulated signal with a power switching stage is comprised of:

providing a constant switching current source for modulation of the system input signal based on the linearly sloped signal frequency, and for providing a constant switching voltage for the power switching stage.

21. The method for signal amplification as set forth in claim 20, wherein:

the act of providing the constant switching current source and the constant switching voltage is comprised of the act of:

providing the system input signal based on the linearly sloped signal frequency to the power switching stage in accordance with one of a first polarity and a second polarity.

22. The method for signal amplification as set forth in claim 15, wherein:

the act of recovering the main output signal is comprised of an act of demodulating the modulated signal for removal of a modulation component; and the act of demodulating is comprised of filtering the modulation component through one or more low pass filters for output of the main output signal for the load.

* * * * *